(12) United States Patent
Loewenstein

(10) Patent No.: US 8,943,014 B2
(45) Date of Patent: Jan. 27, 2015

(54) DETERMINATION OF STATISTICAL ERROR BOUNDS AND UNCERTAINTY MEASURES FOR ESTIMATES OF NOISE POWER SPECTRAL DENSITY

(75) Inventor: Edward B. Loewenstein, Austin, TX (US)

(73) Assignee: National Instruments Corporation, Austin, TX (US)

( * ) Notice: Subject to any disclaimer, the term of this patent is extended or adjusted under 35 U.S.C. 154(b) by 679 days.

(21) Appl. No.: 13/272,991

(22) Filed: Oct. 13, 2011

(65) Prior Publication Data

US 2013/0093770 A1    Apr. 18, 2013

(51) Int. Cl.
 G06N 5/02    (2006.01)
 G01R 29/26   (2006.01)
 G06T 11/20   (2006.01)

(52) U.S. Cl.
 CPC .............. *G01R 29/26* (2013.01); *G06T 11/206* (2013.01)
 USPC .......................................................... 706/52

(58) Field of Classification Search
 CPC ........... H04B 17/0045; H04B 17/0055; G01R 26/26; G06N 5/02; G06T 11/206
 USPC ............. 706/52; 704/226, 264; 375/147, 260, 375/277; 381/56, 58; 345/440
 See application file for complete search history.

(56) References Cited

U.S. PATENT DOCUMENTS

| 6,263,307 | B1 * | 7/2001 | Arslan et al. ................... 704/226 |
| 6,344,749 | B1 | 2/2002 | Williams |
| 6,778,591 | B2 | 8/2004 | Sato |
| 7,236,534 | B1 * | 6/2007 | Morejon et al. .............. 375/260 |
| 8,018,589 | B2 | 9/2011 | MacKinnon et al. |
| 2001/0036221 | A1 * | 11/2001 | Sato ............................... 375/147 |
| 2004/0185781 | A1 * | 9/2004 | Moloudi ...................... 455/63.1 |
| 2009/0135419 | A1 | 5/2009 | Finarov |
| 2010/0067710 | A1 * | 3/2010 | Hendriks et al. ................ 381/58 |

(Continued)

OTHER PUBLICATIONS

Martin R., "Bias compensation methods for minimum statistics noise power spectral density estimation", Signal Processing, 86, 2006, pp. 1215-1229.*

(Continued)

*Primary Examiner* — Jeffrey A Gaffin
*Assistant Examiner* — Dave Misir
(74) *Attorney, Agent, or Firm* — Meyertons Hood Kivlin Kowert & Goetzel, P.C.; Jeffrey C. Hood; Mark K. Brightwell

(57) ABSTRACT

Systems/methods for computing a power spectral density estimate for a noise signal. Where the noise signal appears in two channels (a single channel), n successive data acquisitions from the two channels (the single channel) are used to compute n respective cross (power) spectral densities, which are then averaged. The averaged cross (power) spectral density may then be smoothed in the spectral domain. The magnitude of the smoothed cross (power) spectral density comprises an estimate for the noise power spectral density. An effective number of independent averages may be computed based on the number n, the time-domain window applied to the acquired sample sets, the amount of overlap between successive sample sets, and the shape of the frequency-domain smoothing function. A statistical error bound (or uncertainty measure) may be determined for the power spectral density estimate based on the effective number of averages and the averaged single-channel and cross-channel spectral estimates.

12 Claims, 13 Drawing Sheets

(56) References Cited

U.S. PATENT DOCUMENTS

| | | | |
|---|---|---|---|
| 2010/0239098 A1* | 9/2010 | Christoph | 381/56 |
| 2011/0013075 A1* | 1/2011 | Kim et al. | 348/370 |
| 2011/0015931 A1* | 1/2011 | Kawahara et al. | 704/264 |
| 2011/0093225 A1* | 4/2011 | Ramesh et al. | 702/67 |
| 2012/0093333 A1* | 4/2012 | Hu et al. | 381/71.7 |
| 2012/0217980 A1* | 8/2012 | Pausini | 324/613 |
| 2013/0054231 A1* | 2/2013 | Jeub et al. | 704/226 |
| 2013/0142343 A1* | 6/2013 | Matsui et al. | 381/56 |

OTHER PUBLICATIONS

Martin R., "Noise Power Spectral Density Estimation Based on Optimal Smoothing and Minimum Statistics", IEEE Transactions on Speech and Audio Processing, vol. 9, No. 5, Jul. 2001, pp. 504-512.*

Sonnenschein A. et al., "Radiometric Detection of Spread-Spectrum Signals in Noise of Uncertain Power", IEEE Transactions on Aerospace and Electronic Systems, vol. 28, No. 3, Jul. 1992, pp. 654-660.*

"5125A Phase Noise Test Set—Operations and Maintenance Manual;" Symmetricom Corp., Part No. DOC05125A Rev C, Jun. 17, 2010; pp. 29-31.

Randall, R.B.; "Frequency Analysis;" Brüel & Kjær, Denmark, 3rd Edition, ISBN-13: 978-8787355070, 1987; pp. 230-238.

Stensby, John; "Chapter 8—Power Density Spectrum;" Class Notes for University of Alabama in Huntsville Course, Apr. 22, 2010, retrieved from <http://www.ece.uah.edu/courses/ee385/500ch8.pdf> on Dec. 20, 2012; pp. 1-18.

Sobering, Tim J.; "Equivalent Noise Bandwidth;" Kansas State University, May 1991, revised Jun. 25, 2008, retrieved from <http://www.k-state.edu/ksuedl/publications/Technote%201%20-%20Equivalent%20Noise%20Bandwidth.pdf> on Dec. 20, 2012; pp. 1-3.

"Spectral density;" Wikipedia, version as of Oct. 9, 2012, retrieved from <http://en.wikipedia.org/w/index.php?title=Spectral_density&oldid=516788162> on Dec. 20, 2012; pp. 1-8.

Bendat, J.S.; Piersol, A.G.; "Engineering Applications of Correlation and Spectral Analysis;" May 13, 1980, Wiley-Interscience, New York, NY; pp. 54, 72, 76-77.

* cited by examiner

600 perform n iterations of a set of operations in order to obtain n corresponding complex-valued cross spectral densities between a signal a(t) from a first channel and a signal b(t) from a second channel, where the signal a(t) is a sum of a first interfering noise signal and the target noise signal, where the signal b(t) is a sum of a second interfering noise signal and the target noise signal, where n is an integer greater than one, where the set of operations includes: acquiring a set of samples of the signal a(t); acquiring a set of samples of the second signal b(t), where the set of samples of the signal a(t) and the set of samples of the signal b(t) are acquired simultaneously; and computing a complex-valued cross spectral density between the sample set of the signal a(t) and the sample set of the signal b(t)  610 average the n complex-valued cross spectral densities to obtain a complex-valued averaged cross spectral density  620 smooth the complex-valued averaged cross spectral density in the frequency domain to obtain a complex-valued smoothed cross spectral density  630 store the estimate of the power spectral density of the target noise signal in a memory 640

Fig. 6A

650 

smooth a complex-valued averaged cross spectral density to obtain a complex-valued smoothed cross spectral density, where the estimate of the power spectral density of the target noise signal is based on the complex-valued smoothed cross spectral density, where the complex-valued averaged cross spectral density is an average of n complex-valued cross spectral densities, where n is an integer greater than one, where each of the n complex-valued cross spectral densities is computed based on a corresponding one of n two-channel acquisitions, where each of the two-channel acquisitions includes an acquisition of a set of samples of a signal a(t) from a first channel and a simultaneous acquisition of a set of samples of a signal b(t) from a second channel, where the signal a(t) is a sum of a first interfering noise signal and the target noise signal, where the signal b(t) is a sum of a second interfering noise signal and the target noise signal   655 determine an estimate of the power spectral density of the target noise signal based on the complex-valued smoothed cross spectral density, where the estimate of the power spectral density of the target noise signal is stored in a memory   660

determine a statistical error bound for an estimate of a power spectral density of a target noise signal y(t), where the estimate is determined by averaging n complex-valued cross spectral densities to obtain a complex-valued averaged cross spectral density, where the n complex-valued cross spectral densities are computed based on n respective two-channel data sets, where each two-channel data set includes a set of samples of a signal a(t) acquired from a first channel and a corresponding set of samples of a signal b(t) acquired from a second channel, where each set of samples of the signal a(t) and the corresponding set of samples of the second signal b(t) are acquired over the same interval of time, where the signal a(t) is a sum of a first interfering noise signal and the target noise signal y(t), where the signal b(t) is a sum of a second interfering noise signal and the target noise signal y(t), where the action of determining the statistical error bound includes computing the statistical error bound based on an expression of the form $(A^2+T^2)^{1/2}$, where A depends on the number n, where T depends on the number n and a coherence function associated with the complex-valued averaged cross spectral density   710 store the statistical error bound in a memory   720

Fig. 7A

800 determine a measure of uncertainty for an estimate of a power spectral density of a noise signal, where the estimate is determined by computing an average of n power spectral densities derived from n respective sets of samples of the noise signal, where each of the n power spectral densities is computed based on a corresponding one of the sample sets, where the action of determining the uncertainty measure includes computing the uncertainty measure based on the number n.   810 store the uncertainty measure in a memory   820

Fig. 7B

850 ↘ determine a statistical upper bound for an estimate of a power spectral density of a target noise signal y(t), where the estimate is determined by averaging n complex-valued cross spectral densities to obtain a complex-valued averaged cross spectral density and spectrally smoothing the complex-valued averaged cross spectral density to obtain the estimate, where the n complex-valued cross spectral densities are computed based on n respective two-channel data sets, where each two-channel data set includes a set of samples of a signal a(t) acquired from a first channel and a corresponding set of samples of a signal b(t) acquired from a second channel, where each set of samples of the signal a(t) and the corresponding set of samples of the second signal b(t) are acquired over the same interval of time, where the signal a(t) is a sum of a first interfering noise signal and the target noise signal y(t), where the signal b(t) is a sum of a second interfering noise signal and the target noise signal y(t), where the action of determining the statistical upper bound includes computing the statistical upper bound based on the number n, the complex-valued averaged cross spectral density, a first spectral density and a second spectral density, where the first spectral density is an averaged power spectral density for the signal a(t), where the second spectral density is an averaged power spectral density for the signal b(t).   855

↓ store the statistical upper bound in a memory   870

Fig. 8

DETERMINATION OF STATISTICAL ERROR BOUNDS AND UNCERTAINTY MEASURES FOR ESTIMATES OF NOISE POWER SPECTRAL DENSITY

FIELD OF THE INVENTION

The present invention relates to the field of noise estimation, and more particularly, to mechanisms for estimating the power spectral density of a noise signal and for determining the uncertainty associated with such estimates.

DESCRIPTION OF THE RELATED ART

Electronic devices generate random noise. It is important to be able to estimate the power spectral density of the random noise and to estimate the uncertainty associated with such estimates. One prior art method for determining the power spectral density estimate is to acquire a series of sets of samples of the noise signal, compute respective power spectral densities, and average the computed power spectral densities. Where the noise appears in each of two signal channels, an alternative method for determining the power spectral density estimate includes: acquiring a series of two-channel data sets, where each two-channel data set includes a set of samples from the first channel and a set of samples from the second channel; computing respective cross spectral densities, averaging the cross spectral densities. The uncertainty of the power spectral density estimate depends on the number of data sets included in the average. Driving the uncertainty down to an acceptably small value may require a large number of data sets.

SUMMARY

In one embodiment, a computational method for estimating a power spectral density of a target noise signal may involve the following actions. The method involves vector smoothing, i.e., the operation of smoothing a complex-valued mean cross-spectral density in the frequency domain.

The method may include performing n iterations of a set of operations in order to obtain n corresponding complex-valued cross spectral densities between a signal a(t) from a first channel and a signal b(t) from a second channel. The signal a(t) is a sum of a first interfering noise signal and the target noise signal. The signal b(t) is a sum of a second interfering noise signal and the target noise signal. The integer n is greater than one. The set of operations includes: acquiring a set of samples of the signal a(t); acquiring a set of samples of the second signal b(t), where the set of samples of the signal a(t) and the set of samples of the signal b(t) are acquired simultaneously; and computing a complex-valued cross spectral density between the sample set of the signal a(t) and the sample set of the signal b(t).

The method may also include averaging the n complex-valued cross spectral densities to obtain a complex-valued averaged cross spectral density.

The method may also include smoothing the complex-valued averaged cross spectral density in the frequency domain to obtain a complex-valued smoothed cross spectral density. The estimate of the power spectral density of the target noise signal is based on the complex-valued smoothed cross spectral density (e.g., by computing the magnitude of the smoothed cross spectral density).

The method may also include storing the estimate of the power spectral density of the target noise signal in a memory. The power spectral density estimate may be displayed as a graph on a display screen.

In another embodiment, a computational method for estimating a power spectral density of a target noise signal may involve the following actions.

The method may include smoothing a complex-valued averaged cross spectral density to obtain a complex-valued smoothed cross spectral density. The complex-valued averaged cross spectral density is an average of n complex-valued cross spectral densities, where n is an integer greater than one. Each of the n complex-valued cross spectral densities is computed based on a corresponding one of n two-channel acquisitions. Each of the two-channel acquisitions includes an acquisition of a set of samples of a signal a(t) from a first channel and a simultaneous acquisition of a set of samples of a signal b(t) from a second channel. The signal a(t) is a sum of a first interfering noise signal and the target noise signal. The signal b(t) is a sum of a second interfering noise signal and the target noise signal.

The method may also include determining an estimate of the power spectral density of the target noise signal based on the complex-valued smoothed cross spectral density. The estimate of the power spectral density of the target noise signal is stored in a memory.

In one embodiment, a computational method may include determining a statistical error bound at each frequency for an estimate of a power spectral density of a target noise signal y(t). The power spectral density estimate may be determined by averaging n complex-valued cross spectral densities to obtain a complex-valued averaged cross spectral density. (In some embodiments, the determination of the power spectral density estimate may also include spectrally smoothing the complex-valued averaged cross spectral density.) The n complex-valued cross spectral densities are computed based on n respective two-channel data sets. Each two-channel data set includes a set of samples of a signal a(t) acquired from a first channel and a corresponding set of samples of a signal b(t) acquired from a second channel. Each set of samples of the signal a(t) and the corresponding set of samples of the second signal b(t) are acquired over the same interval of time. The signal a(t) is a sum of a first interfering noise signal and the target noise signal y(t); the signal b(t) is a sum of a second interfering noise signal and the target noise signal y(t).

The action of determining the statistical error bound may include computing the statistical error bound based on an expression of the form $\sqrt{A^2+T^2}$, where A depends on the number n, and where T depends on the number n and a coherence function associated with the complex-valued averaged cross spectral density.

In situations where the two-channel data sets are overlapped in time, the action of determining the statistical error bound may include computing an effective number of independent averages corresponding to the power spectral density estimate based on the number n and the relative amount of time overlap between successive ones of the two-channel data sets. Thus, the value A may be computed using this effective number, and the value T may be computed using this effective number and the coherence function.

In the case where the power spectral density estimate is determined using spectral smoothing (in addition to the averaging of the n complex-valued cross spectral densities), the action of determining the statistical error bound may include computing an effective number of independent averages corresponding to the power spectral density estimate based on data including: the number n, information specifying a time-domain window that is applied to the sample sets of the signal a(t) and to the sample sets of the signal b(t), and information specifying the filter used to perform the spectral smoothing (and perhaps also, the relative amount of time overlap between successive ones of the two-channel data sets). In this case, the value A may be computed based on this effective number, and the value T may be computed based on this effective number and on a coherence function associated with the spectrally smoothed cross spectral density.

The method may also include storing the statistical error bound in a memory. The statistical error bound may be displayed along with a graph of the power spectral density estimate.

In one embodiment, a computational method may include determining a measure of uncertainty for an estimate of a power spectral density of a noise signal from a single-channel measurement. The power spectral density estimate may be determined by computing an average of n power spectral densities derived from n respective sets of samples of the noise signal. (In some embodiments, the determination of the power spectral density estimate may also include spectrally smoothing the average of the n power spectral densities.) Each of the n power spectral densities is computed based on a corresponding one of the sample sets.

The action of determining the uncertainty measure includes computing the uncertainty measure based on the number n.

In situations where the sample sets are overlapped in time, the action of determining the uncertainty measure may include computing an effective number of independent averages corresponding to the power spectral density estimate based on the number n and the relative amount of time overlap between successive ones of the sample sets. The uncertainty measure may be computed based on this effective number.

In the case where the power spectral density estimate is determined using spectral smoothing (in addition to the averaging of the n power spectral densities), the action of determining the uncertainty measure may include computing an effective number of independent averages corresponding to the power spectral density estimate based on data including: the number n; information specifying a time-domain window that is applied to each of the n sample sets; and the filter used to perform the spectral smoothing (and perhaps also, a relative amount of overlap between successive ones of the n sample sets). The uncertainty measure may be computed based on this effective number.

The method may also include storing the uncertainty measure in a memory. The uncertainty measure may be displayed on a display screen along with a graph of the power spectral density estimate.

In one embodiment, a computational method includes acquiring n two-channel data sets and storing the n two-channel data sets in a memory, wherein for each two-channel data set said acquiring comprises: acquiring a set of samples of a signal a(t) from a first channel, wherein the signal a(t) is a sum of a first interfering noise signal and a target noise signal y(t); and acquiring a set of samples of a signal b(t) from a second channel, wherein the signal b(t) is a sum of a second interfering noise signal and the target noise signal y(t), wherein the sample set of the signal a(t) and the sample set of the signal b(t) are acquired over the same interval of time.

The computational method may also include determining a statistical upper bound for an estimate of a power spectral density of a target noise signal y(t). The estimate is determined by averaging n complex-valued cross spectral densities to obtain a complex-valued averaged cross spectral density. (In some embodiments, the determination of the power spectral density estimate may also include spectrally smoothing the complex-valued averaged cross spectral density.) The n complex-valued cross spectral densities are computed based respectively on the n two-channel data sets.

The action of determining the statistical upper bound may include computing the statistical upper bound based on the number n, the complex-valued averaged cross spectral density, a first spectral density and a second spectral density, wherein the first spectral density is an averaged power spectral density for the signal a(t), wherein the second spectral density is an averaged power spectral density for the signal b(t).

In situations where the two-channel data sets are overlapped in time, the action of determining the statistical upper bound may include computing an effective number of independent averages corresponding to the power spectral density estimate based on the number n and the relative amount of time overlap between successive ones of the two-channel data sets. The statistical upper bound may be computed based on this effective number, the complex-valued averaged cross spectral density, the first spectral density and the second spectral density.

In the case where the power spectral density estimate is determined using spectral smoothing (in addition to the averaging of the n complex-valued cross spectral densities), the action of determining the statistical upper bound may include computing an effective number of independent averages corresponding to the power spectral density estimate based on data including: the number n; information specifying a time-domain window that is applied to the sample sets of the signal a(t) and to the sample sets of the signal b(t); and information specifying the filter used to perform said spectrally smoothing. In this case, the statistical upper bound may be computed based on the effective number of averages, the spectrally smoothed version of the complex-valued averaged cross spectral density, a spectrally smoothed version of the first spectral density, and a spectrally smoothed version of the second spectral density.

The statistical upper bound may be stored in a memory. A graph of the statistical upper bound may be displayed along with a graph of the power spectral density estimate of the target noise signal.

BRIEF DESCRIPTION OF THE DRAWINGS

A better understanding of the present invention can be obtained when the following detailed description of the preferred embodiments is considered in conjunction with the following drawings.

FIG. 6A illustrates one embodiment of a method for obtaining an estimate of a power spectral density of a target noise signal.

FIG. 6B illustrates another embodiment of a method for obtaining an estimate of a power spectral density of a target noise signal.

FIG. 7A illustrates one embodiment of a method for determining an error bound for a noise power spectral density estimate based on a series of two-channel acquisitions.

FIG. 7B illustrates one embodiment of a method for determining an uncertainty measure for a noise power spectral density estimate based on a series of one-channel acquisitions.

FIG. 8 illustrates one embodiment of a method for determining a statistical upper bound for a noise power spectral density estimate based on a series of two-channel acquisitions.

Figure 1A:
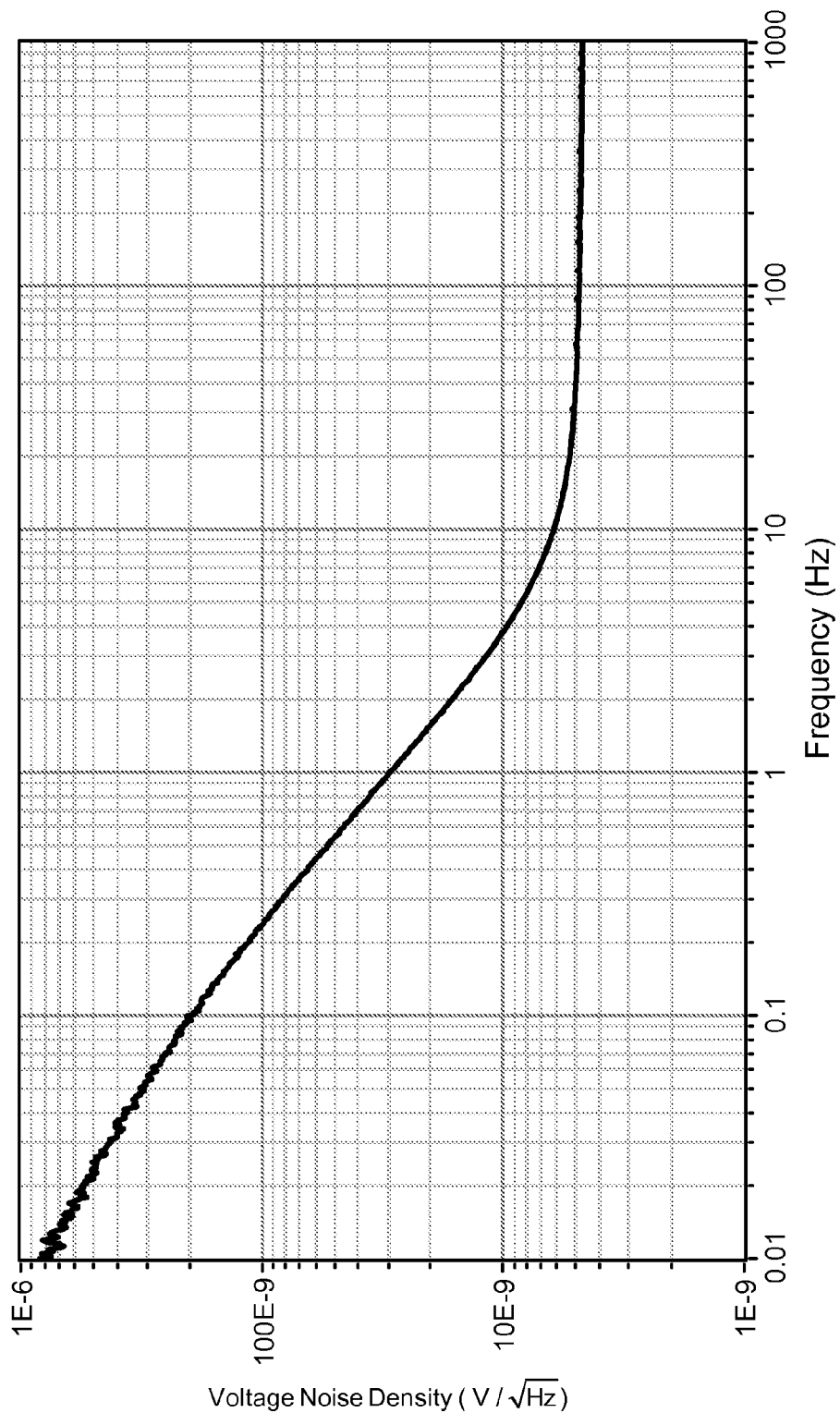
FIG. 1A is a graph of the spectral density of the input voltage noise of an OPA627 op amp.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Terminology

The following is a glossary of terms used in the present document.

Memory Medium—A memory medium is a medium configured for the storage and retrieval of information. Examples of memory media include: various kinds of semiconductor memory such as RAM and ROM; various kinds of magnetic media such as magnetic disk, tape, strip, film, etc.; various kinds of optical media such as CD-ROM and DVD-ROM; various media based on the storage of electrical charge and/or other physical quantities; media fabricated using various lithographic techniques; etc. The term "memory medium" may also include a set of two or more memory media which reside at different locations, e.g., at different computers that are connected over a network.

Programmable Hardware Element—a hardware device that includes multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. As used herein, the term "program" includes within its scope of meaning: 1) a software program which is stored in a memory and is executable by a processor, or, 2) a hardware configuration program useable for configuring a programmable hardware element. Any of the method embodiments described herein, or, any combination of the method embodiments described herein, or, any subset of any of the method embodiments described herein, or, any combination of such subsets may be implemented in terms of one or more programs.

Software Program—the term "software program" is intended to have the full breadth of its ordinary meaning, and includes any type of program instructions, code, script and/or data, or combinations thereof, that may be stored in a memory medium and executed by a processor or computer system. Exemplary software programs include: programs written in text-based programming languages such as C, C++, Java™, Pascal, Fortran, Perl, etc.; graphical programs (programs written in graphical programming languages); assembly language programs; programs that have been compiled to machine language; scripts; and other types of executable software. A software program may comprise two or more subprograms that interoperate in a specified manner.

Hardware Configuration Program—a program, e.g., a netlist or bit file, that can be used to program or configure a programmable hardware element.

Computer System—any of various types of computing or processing systems, including a personal computer (PC), a mainframe computer system, a workstation, a laptop, a tablet computer, a network appliance, an Internet appliance, a hand-held or mobile device, a personal digital assistant (PDA), a television system, a grid computing system, or other device or combination of devices. In general, the term "computer system" can be broadly defined to encompass any device (or combination of devices) having at least one processor that is configured to execute program instructions that are stored on a memory medium.

Computational Device—an electronic system that is programmable to execute arbitrary computational algorithms. The term "computational device" includes within its scope of meaning any of the following: a computer system, a set of one or more interconnected computer systems, a system including one or more programmable hardware elements, a system including one or more programmable processors and one or more programmable hardware elements. Any of the various embodiments described herein may be implemented using a computational device.

The various embodiments disclosed herein may be realized in any of various forms. For example, any of the embodiments disclosed herein may be realized as a computer-implemented method, a computer-readable memory medium, or a computer system. Furthermore, any of the embodiments disclosed herein may be realized in terms of one or more appropriately-configured programmable hardware elements (PHEs). Yet furthermore, any of the embodiments disclosed herein may be realized in terms of one or more digital circuits, e.g., custom-designed digital circuits.

A computer-readable memory medium is a memory medium that stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may include a processor (or a set of processors) and a memory medium. The memory medium stores program instructions. The processor is configured to read and execute the program instructions from the memory medium. The program instructions are executable by the processor to implement a method, e.g., any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a mobile device, a tablet computer, a wearable computer, a computer integrated in a head-mounted display, etc.

In some embodiments, a set of computers distributed across a computer network may be configured to partition the effort of executing a computational method (e.g., any of the method embodiments disclosed herein).

Spectral Noise Density Measurements

Spectral noise density may be measured by acquiring many blocks of data in the time domain, computing the Fourier transform of each acquisition, and averaging the resulting spectra. The averaging serves two purposes: first, to reduce the uncertainty of the density estimates since the measured noise data, being random, causes the power spectral density measurements themselves to be random; and second, to remove contributions of other interfering but uncorrelated signals when using a two-channel cross-correlation scheme. This disclosure will quantify how well resolved the averaged results are and how much statistical confidence one can have in the results.

FIG. 1 illustrates two examples of noise density measurements. The first plot is the input voltage noise density of an op amp. The vertical units are in $V/\sqrt{Hz}$. Technically, with power spectral density the units should be $V^2/Hz$ (power per unit of bandwidth), but the former is easier to interpret and so the square root is taken. The second plot is the phase noise of a signal generator. With phase noise, the usual vertical units are dBc/Hz, which indicate the sideband noise power per unit bandwidth with respect to the carrier power.

Note that both plots use a logarithmic frequency scale. This is done conventionally because the noise density is of interest over a wide range of frequencies. Each plot is the result of thousands of averages.

Fourier Transform

Let a(t) be the time-domain signal present in a channel. Then its Fourier transform is:

$$A(f) = \mathcal{F}\{a(t)\} = \int_{-\infty}^{\infty} a(t) \exp(-j2\pi ft) dt. \quad (1)$$

This integral depends on knowing the signal value a(t) at all times in the continuum of $-\infty$ to $+\infty$. Of course, a computer-based signal acquisition from a channel is taken only over a finite interval of time, and at a finite number of discrete times, normally evenly-spaced in time. So, if N samples are taken during each interval of sample period T, let $$a_i = a(iT) = a(t)$$

for i=0, 1, 2 . . . , N−1. Then the Discrete Fourier Transform (DFT) of $\{a_i\}$ is:

$$A_k = A(kf_0) \quad (2)$$
$$= \mathcal{F}\{a_i\}$$
$$= \frac{1}{N} \sum_{i=0}^{N-1} a_i \exp(-j2\pi ki/N).$$

The DFT may be implemented using an FFT.

The $a_i$ are real-valued. Thus, the $A_k$ are conjugate symmetric in frequency, i.e. $A_k = A_{N-k}^*$. This means that half of the spectrum $\{A_k\}$ is redundant. The half of the spectrum above the Nyquist frequency is often thrown away. In order to preserve the power that the redundant half would have included, the coefficients $\{A_k\}$ may be redefined according to the expressions:

$$A_k = A(kf_0) \quad (3)$$
$$= \sqrt{2}\,\mathcal{F}\{a_i\}$$
$$= \frac{\sqrt{2}}{N} \sum_{i=0}^{N-1} a_i \exp(-j2\pi ki/N), k > 0$$

$$\text{and } A_0 = \frac{1}{N} \sum_{i=0}^{N-1} a_i.$$

Thus, if $\{a_i\}$ represents a sine wave with an rms amplitude of unity, the magnitude of $A_k$ is equal to unity when k corresponds to the frequency of the sine wave.

The power spectrum is computed as the square of the magnitude of $A_k$, or equivalently, the product of $A_k$ and its complex conjugate $A_k^*$. This product, $A_k^*A_k$, is always real and non-negative, even if $A_k$ is complex-valued.

Power Spectral Density

The power spectral density is computed from $A_k^*A_k$ by normalizing the power in each frequency bin by the equivalent noise bandwidth (ENBW) of the FFT. In an unwindowed FFT, the ENBW is the sample rate $f_s$ divided by the number of points in the FFT and is equal to the bin width of the frequency bins in Hz. Hence the power spectral density, denoted $\hat{G}_{aa}$, is computed as:

$$\hat{G}_{aa}(k) = \left(\frac{N}{f_s}\right) A_k^* A_k. \quad (4)$$

Often, the acquired time-domain data is windowed to improve spectral dynamic range by multiplying the data by the time-domain sequence $\{w_i\}$ before the FFT is computed. The window may have an effective gain (coherent gain, or CG) other than unity, and so the data going into or coming out of the calculation of $\hat{G}_{aa}$ may be scaled by CG. The window also normally has an ENBW of greater than one frequency bin width, and so the PSD may also be scaled accordingly.

Figure 2A:
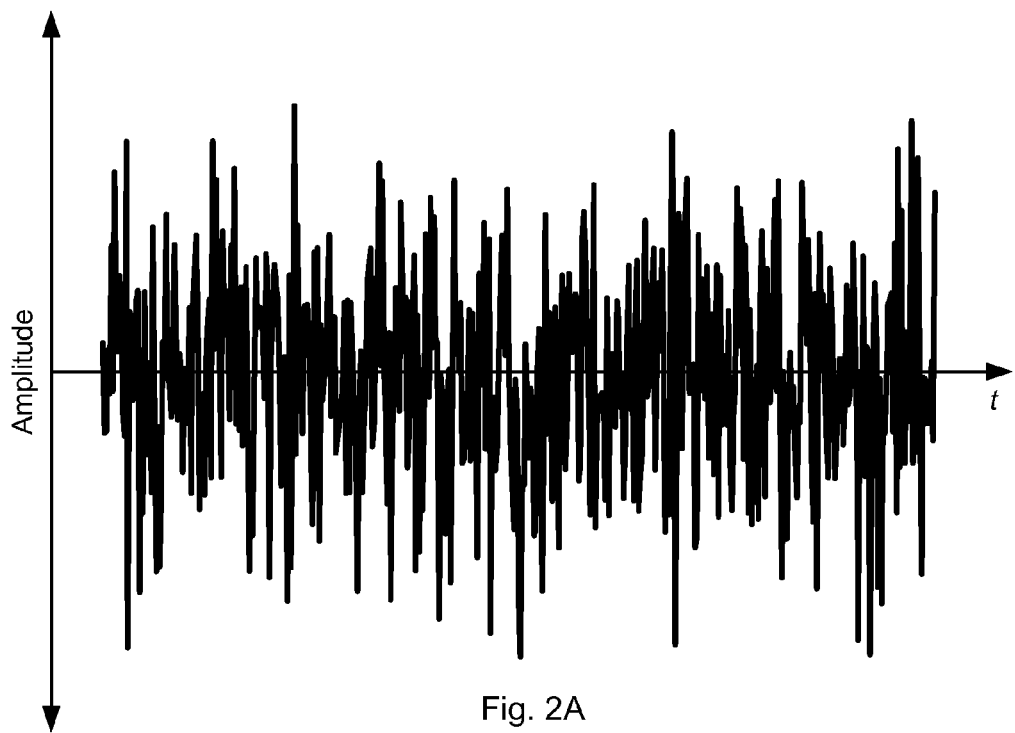
FIG. 2A shows a time-domain noise signal without windowing.
Figure 2B:
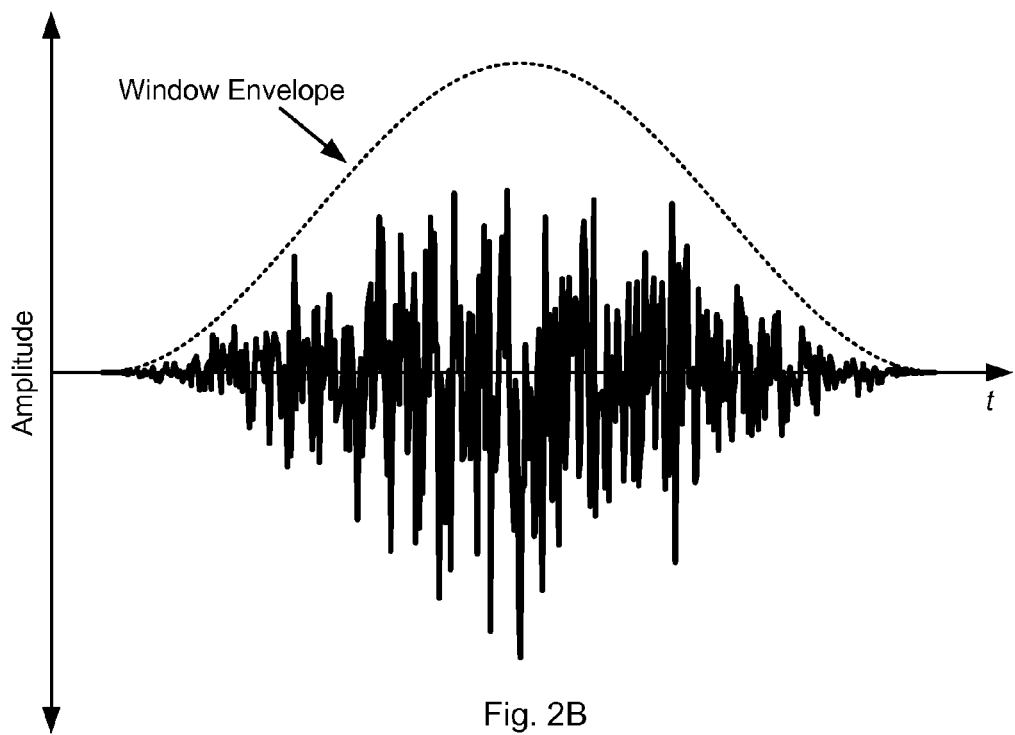
FIG. 2B shows the same signal with a Hann window applied.

The value for CG is calculated as:

$$CG = \frac{1}{N} \sum_{i=0}^{N-1} w_i, \quad (5)$$

and ENBW is calculated as:

$$ENBW = \frac{1}{(CG)^2 N} \sum_{i=0}^{N-1} w_i^2, \quad (6)$$

where ENBW is measured in FFT bin widths. CG normally varies between 0.25 and 1.00. (However, windows having values of CG outside that range may be used as well.) ENBW normally varies between 1.00 and 3. (However, windows having values of ENBW outside that range may be used as well.) For the commonly-used Hann window (sometimes incorrectly called a "Hanning" window), CG=0.5 and ENBW=1.5. FIG. 2A shows a time-domain noise signal without windowing. FIG. 2B shows the same signal with a Hann window applied.

With these two constants (CG and ENBW), the power spectral density (PSD) for a windowed acquisition may be calculated as:

$$\hat{G}_{aa}(k) = \frac{1}{ENBW(CG)^2}\left(\frac{N}{f_s}\right)A_k^* A_k. \quad (7)$$

Cross-Spectral Density

In some circumstances, the noise signal of interest occurs in two channels. Thus, a signal $\{a_i\}$ may be acquired from one of the channels, and a signal $\{b_i\}$ may be acquired from the other channel. The signals $\{a_i\}$ and $\{b_i\}$ may be subjected to cross-correlation, with the goal being to extract the spectral data (due to the noise signal of interest) that is common to the two acquired channels and to eliminate the unrelated (uncorrelated) noise that might be added by the acquisition channels. The cross-spectral density (CSD) of the signals $\{a_i\}$ and $\{b_i\}$ may be computed according to the expression:

$$\hat{G}_{ab}(k) = \frac{1}{ENBW(CG)^2}\left(\frac{N}{f_s}\right)A_k^* B_k. \quad (8)$$

Note that the CSD comprises a sequence of complex numbers.

Averaging

The hats in $\hat{G}_{aa}$ and $\hat{G}_{ab}$ are used to denote that they are only (noisy) estimates of their respective underlying true spectral densities, $G_{aa}$ and $G_{ab}$. Both power spectral density estimates and cross-spectral density estimates can be improved by averaging. In other words, a number of the estimates $\hat{G}_{aa}$, corresponding to respective acquisitions of the signal a(t), may be averaged to obtain an improved estimate of the spectral density $G_{aa}$. Similarly, a number of the estimates $\hat{G}_{ab}$, corresponding to respective acquisitions of the signal pair $\{a(t), b(t)\}$, may be averaged to obtain an improved estimate of the spectral density $G_{ab}$. (An acquisition of the signal pair $\{a(t), b(t)\}$ comprises an acquisition of the signal a(t) and a parallel acquisition of the signal b(t).)

In the first case, the estimate $\hat{G}_{aa}$ is always real, and the mean of the probability density distribution of $\hat{G}_{aa}$ is in fact $G_{aa}$. We need only average the PSDs of successive acquisitions to improve the estimate of $G_{aa}$ until we have sufficient statistical confidence in the result.

The case of $G_{ab}$ is not so simple. At least one of the acquisitions $\{a_i\}$ and $\{b_i\}$ is presumed to have information that is not present in the other. It is also possible that each of the acquisitions $\{a_i\}$ and $\{b_i\}$ has information that is not present in the other. Because the values $\hat{G}_{ab}(k)$ are vector quantities (i.e., complex numbers), averaging over multiple acquisitions can reduce the contributions of these uncorrelated signals until the magnitude of the vector average is well below the average of the magnitude. Expressed mathematically, $$|\overline{\hat{G}_{ab}}| \leq \overline{|\hat{G}_{ab}|}, \quad (9)$$

where the bar over a quantity denotes the mean over some number of averages. (In other words, $\overline{\hat{G}_{ab}}$ represents an average taken over a number of instances of the spectrum $\hat{G}_{ab}$. Similarly, $\overline{|\hat{G}_{ab}|}$ represents an average taken over the same number of instances of the magnitude spectrum $|\hat{G}_{ab}|$.)

To see this, let us decompose $A_k$ and $B_k$ into variables $X_{1k}$, $X_{2k}$ and $Y_k$, where all three are uncorrelated with each other and where $$A_k = X_{1k} + Y_k \text{ and}$$

$$B_k = X_{2k} + Y_k.$$

Signals $X_{1k}$ and $X_{2k}$ represent the noise added respectively by the two channels when we are really trying to measure $G_{yy}$, the PSD of $Y_k$.

To calculate $\hat{G}_{ab}$, we write out the product $A_k^* B_k$ as:

$$A_k^* B_k = (X_{1k} + Y_k)^*(X_{2k} + Y_k) \quad (10)$$
$$= X_{1k}^* X_{2k} + X_{1k}^* Y_k + Y_k^* X_{2k} + Y_k^* Y_k.$$

Hence, $$\hat{G}_{ab} = \hat{G}_{x_1 x_2} + \hat{G}_{x_1 y} + \hat{G}_{y x_2} + \hat{G}_{yy}, \quad (11)$$

and when we average the estimates, $$\overline{\hat{G}_{ab}} = \overline{\hat{G}_{x_1 x_2}} + \overline{\hat{G}_{x_1 y}} + \overline{\hat{G}_{y x_2}} + \overline{\hat{G}_{yy}}. \quad (12)$$

Since $X_{1k}$ and $X_{2k}$ are presumed to be uncorrelated with each other, as are $X_{1k}$ and $Y_k$ as well as $X_{2k}$ and $Y_k$, then as the number of averages increases (i.e., the number of acquisitions over which the means are computed), all terms of (12) converge to zero except the last, leaving, in the limit, $$\overline{\hat{G}_{ab}} = \overline{\hat{G}_{yy}}. \quad (13)$$

Thus, we can measure $G_{yy}$ by averaging a sufficient number of acquisitions of $\hat{G}_{ab}$. Because of this property, the cross-correlation technique is able to resolve spectral information well below the spectral noise floors of the individual measurement channels.

Probability Density Distributions

Let $X_1$ and $X_2$ be complex random variables, with $$X_1 = a_1 + jb_1 \text{ and}$$

$$X_2 = a_2 + jb_2,$$

and where $a_1, a_2, b_1, b_2$ are all standard normal, i.e., $$a_1, a_2, b_1, b_2 \sim N(0,1).$$

These kinds of variables are the typical results of Fourier power spectra when the input is random noise. Let $\overline{X_1^* X_2}$ denote the average of n independent samples of $X_1^* X_2$, and let $|\overline{X_1^* X_2}|$ denote the magnitude of $\overline{X_1^* X_2}$. $|\overline{X_1^* X_2}|$ is used to calculate the cross-spectral density of $X_1$ and $X_2$, or the power spectral density of $X_1$ when $X_1 = X_2$.

Equivalence

Suppose $X_1 = X_2$, as is the case with a PSD computation and with the $\overline{G_{yy}}$ term of the $G_{ab}$ cross-spectral density measurement (see equation (12)). Then $|\overline{X_1^* X_2}| = |\overline{X_1^* X_1}|$ has a distribution that is proportional to a chi-square distribution with 2n degrees of freedom, with mean and standard deviation:

$$\mu[|\overline{X_1^* X_1}|] = 2 \quad (16)$$

and $$\sigma[|\overline{X_1^* X_1}|] = \frac{2}{\sqrt{n}}. \quad (17)$$

As n increases, the distribution converges to a normal distribution (with the same mean and standard deviation).

If $a_1$, $a_2$, $b_1$ and $b_2$ have a standard deviation other than unity, say s, then both the mean and standard deviation of $|\overline{X_1^* X_1}|$ scale with $s^2$. Hence the ratio of the standard deviation to the mean is always $1/\sqrt{n}$, and so the amount of variation of the estimate of $X_1^* X_1$ in dB is a function only of n. The decibel equivalent of the standard deviation of the estimate error becomes:

$$10\log\left(\frac{\sigma+\mu}{\mu}\right) = 10\log(1/\sqrt{n}+1) \text{ dB}. \quad (18)$$

Similarly, the equivalent $2\sigma$ (95.45%) confidence interval is $$\pm 10\log\left(\frac{2\sigma+\mu}{\mu}\right) = \pm 10\log(2/\sqrt{n}+1) \text{ dB}, \quad (19)$$

but because the actual distribution of $|\overline{X_1^* X_1}|$ is chi-square and not Gaussian, and because of the log transformation, a better estimate of the 95.45% confidence interval is $$\pm 10\log\left(\frac{2}{\sqrt{n}-1}+1\right) \text{ dB}. \quad (20)$$

This quantity will be used later to estimate the measurement uncertainty due to taking only a limited number of averages. Note that in order to achieve ±1 dB of uncertainty with 95.45% confidence, we need to take at least 76 averages. This minimum holds for any spectral power measurement.

Independence

Suppose instead that $X_1$ and $X_2$ represent independent sources of noise, e.g., as is the case with each of the first three terms on the right hand side of equation (12). Then $|\overline{X_1^* X_2}|$ has a distribution that converges to a Rayleigh distribution as $n \to \infty$. The mean and standard deviation are exactly:

$$\mu[|\overline{X_1^* X_2}|] = \pi \prod_{i=1}^{n} \frac{2i-1}{2i} \quad (21)$$

and $$\sigma[|\overline{X_1^* X_2}|] = \sqrt{\frac{4}{n} - \left(\pi \prod_{i=1}^{n} \frac{2i-1}{2i}\right)^2}. \quad (22)$$

These two quantities are approximated very well by:

$$\mu[|\overline{X_1^* X_2}|] \approx \sqrt{\frac{\pi}{n+\frac{4}{\pi}-1}} \quad (23)$$

and $$\sigma[|\overline{X_1^* X_2}|] \approx \sqrt{\frac{4}{n} - \frac{\pi}{n+\frac{4}{\pi}-1}}. \quad (24)$$

As stated above, for large n, the distribution converges to a Rayleigh distribution as:

$$f(y) = \frac{ny}{2} e^{-ny^2/4}, \quad (25)$$

where $$y = |\overline{X_1^* X_2}|. \quad (26)$$

The mean and standard deviation of the limiting Rayleigh distribution are:

$$\mu[y] = \sqrt{\frac{\pi}{n}} \quad (27)$$

and $$\sigma[y] = \sqrt{\frac{4-\pi}{n}}. \quad (28)$$

Equation (23) and (for large n) equation (27) give us an idea of how many averages it will take to remove the uncorrelated noise sufficiently to reveal the correlated noise density. For example, if n is increased by a factor of 10 (presumably increasing the measurement time by a factor of 10), the mean of the uncorrelated cross-spectral power density decreases by a factor of about $\sqrt{10}$. That corresponds to a 5 dB improvement in the visible noise floor. So for each 5 dB improvement in the floor, the measurement will take 10 times as long; a 10 dB improvement will take 100 times, etc. Ultimately, the available measurement time will set a practical limit on how low the noise floor can be resolved, and the cost of the measurement time will have to be weighed against the cost of lower-noise measurement channels in order to achieve a certain level of performance.

Effective Number of Averages

The above-described calculations of the reduction of noise and bias error as a result of averaging the spectral data assume that the number of acquisitions averaged, n, actually represents n independent observations. However, several factors cause the effective number of independent observations (referred to herein as "averages"), which we will call n", to differ from n. First, the spectra from successive acquisitions may not be independent, since the acquisitions may have been overlapped in time in order not to waste any time-domain data that would otherwise be attenuated by the time-domain window near the beginning and end of an acquisition. Secondly, improvement in the noise level and bias error by smoothing the data in the frequency domain (which is weighted averaging across a frequency band) is affected both by the time-domain window applied to the data before the spectrum is computed and by the shape of the frequency-weighting used in the smoothing procedure.

Overlap

Figure 3A:
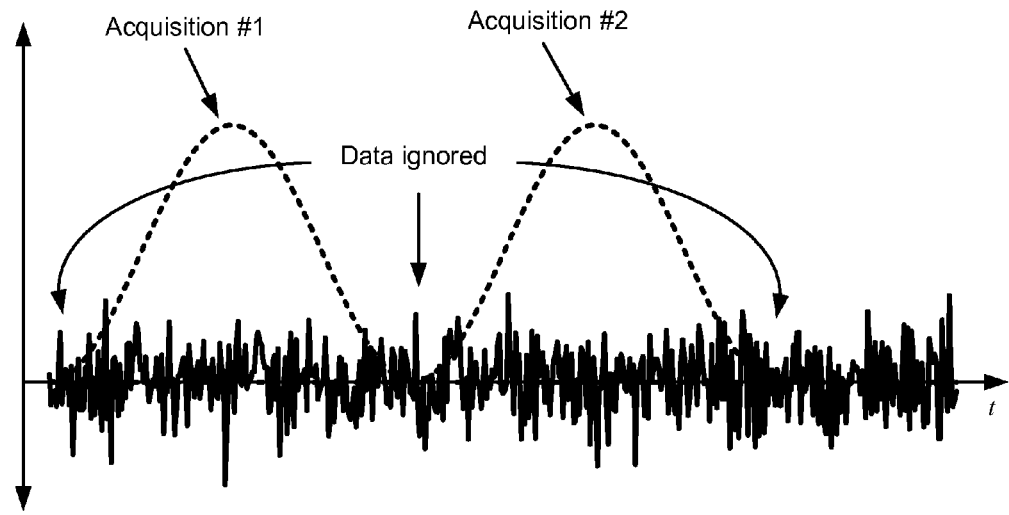
FIG. 3A shows a time-domain noise signal with two Hann-windowed acquisitions, and no overlap between the acquisitions.
Figure 3B:
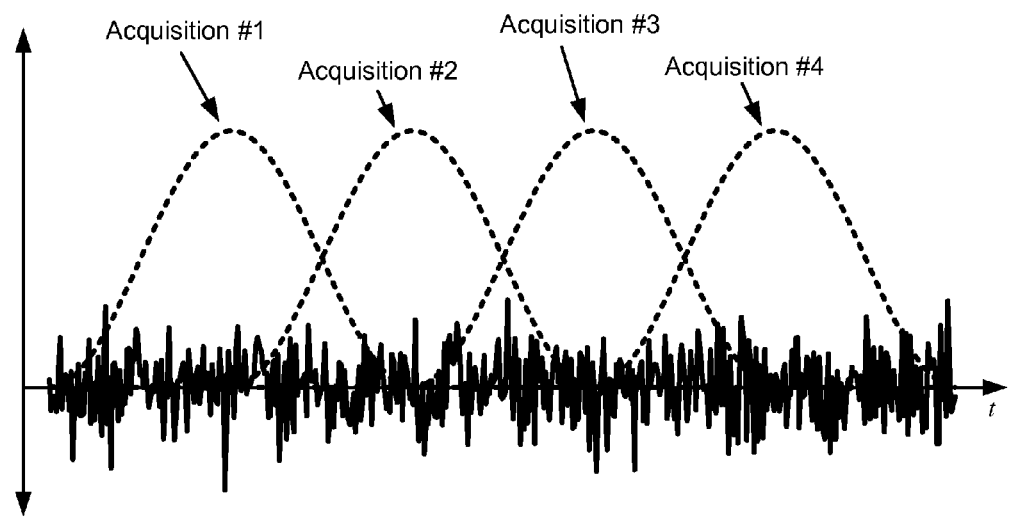
FIG. 3B shows the same signal with four windowed acquisitions, and 50% overlap between successive acquisitions.

When applying a window to the time-domain data, the data near the beginning and end of each acquisition tends to be ignored because of the attenuating shape of the window. To make the most use of the finite amount of time available to acquire data, data from two adjoining acquisitions may be re-used if there is no time gap between the adjoining acquisitions, forming new, albeit not completely independent, acquisitions. See FIG. 3, which shows (a) a time-domain noise signal with two Hann-windowed acquisitions, no overlap, and (b) the same signal with four windowed acquisitions, 50% overlap.

Figure 4:
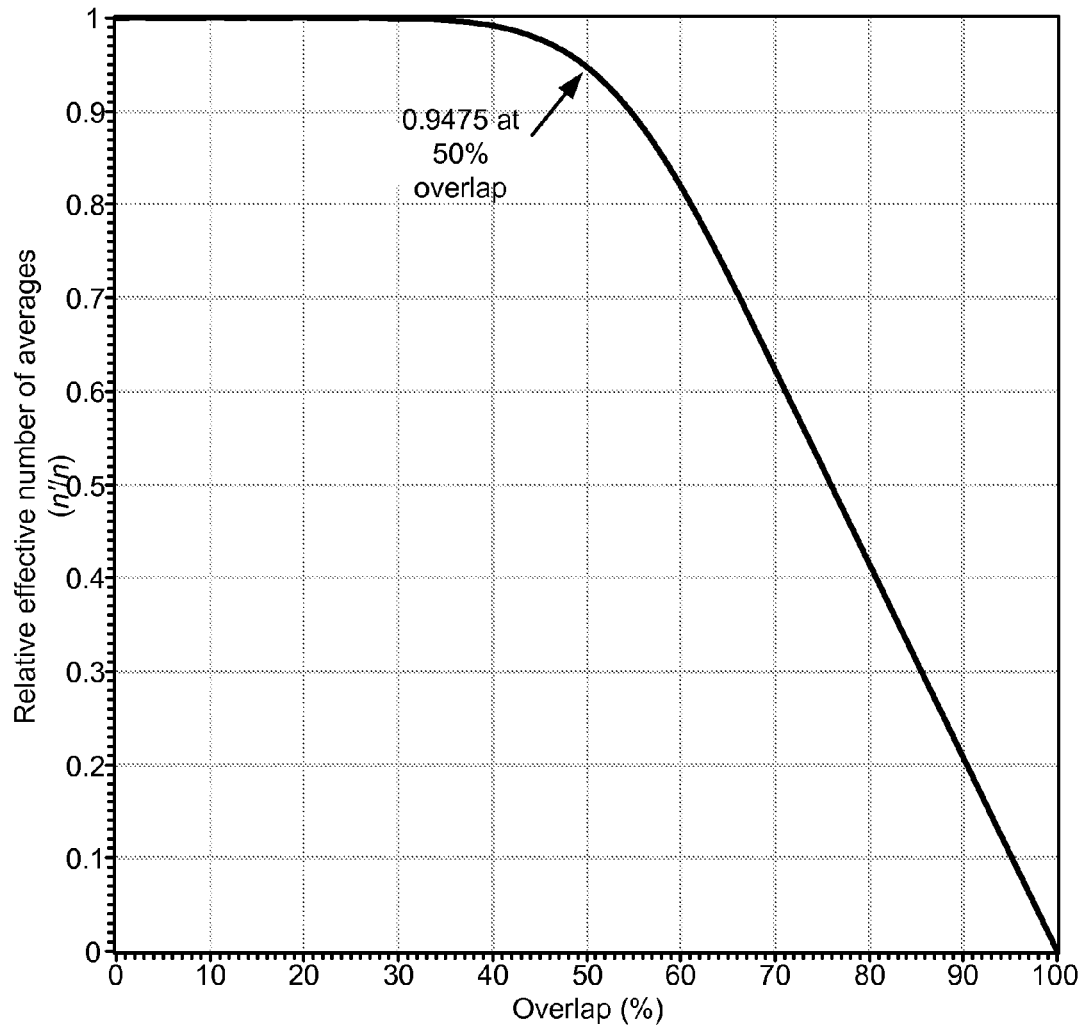
FIG. 4 is a graph of the relative effective number (n'/n) of averages due to overlapping Hann window acquisitions.

Because some (or most) data appears in more than one acquisition when overlapping is used, the acquisitions cannot be considered independent, and the effective number of averages n' will be less than the actual number n. FIG. 4 illustrates this reduction as a function of the amount of overlap when a Hann window is used. As the amount of overlap is increased, the relative effective number of averages is decreased, although the actual number of averages n increases. For example, at 90% overlap there are 10 times the number of acquisitions than would have been taken with no overlap. With a relative effective number of averages of about 0.2079 at 90% overlap, the effective number of averages n' would be $0.2079n$, but n equals $10n_{nol}$, where $n_{nol}$ is the number of averages that could have been taken if no overlap were used, and thus, $n'=2.079 n_{nol}$. For most windows, this gain in effective averages converges to a limit as the overlap approaches 100%. This limit is $1/A$, where $$A = \frac{1}{T}\int_{2t_0}^{2(t_0+T)} \left[\frac{1}{ENBW(CG)^2 T}(w*w)(t)\right]^2 dt, \quad (29)$$

and w(t) is the theoretical window shape defined over the time interval $t \in [t_0, t_0+T]$.

For the Hann window, $$A = \left[\frac{1}{3} + \frac{35}{6(2\pi)^2}\right] \approx 0.481093, \quad (30)$$

which means the best possible gain in effective averages, from having no overlap to having complete overlap, is a factor of about 2.079.

For the Hann window, perhaps the most practical overlap is 50%, where the effective number of averages n' would be $0.9475n$, which is $1.895n_{nol}$, since twice as many acquisitions were taken. This gain of 1.895 is almost as high as the 2.079 limit, but it suffers from only a 5.25% decrease in the effective number of averages from the number of averages actually taken. As a practical matter, the difference between 0.9475 and 1.00 is small enough that the lower figure can be used for both overlapping and non-overlapping situations, simplifying the numerical housekeeping in cases where overlapping may not always be possible due to buffer size limitations.

Spectral Smoothing

The frequency-domain data (e.g., $\overline{\hat{G}_{ab}}$ in the two-channel case, or $\overline{\hat{G}_{aa}}$ in the one-channel case) may be smoothed. This may be done to collapse data that's dense along the frequency axis to a more manageable set of frequencies and/or to improve (i.e., increase) the number of effective averages. Whenever a time-domain window is used on the time-domain samples (before the FFT), the noise data in adjacent FFT frequency bins are not independent. (Multiplication by a window function in the time domain is equivalent to convolution by the transform of the window function in the frequency domain.) So when frequency-domain data is smoothed by averaging, the resulting effective number of averages is not simply the number of acquisitions used to compute $\overline{\hat{G}_{ab}}$ (or $\overline{\hat{G}_{aa}}$) times the number of frequency points smoothed—the correlation between adjacent frequency bins has to be taken into account. Furthermore, the frequency-domain envelope of the averaging weights used to perform the smoothing tends to emphasize data nearest the nominal frequency point and attenuate data farthest away in frequency. This also causes the effective number of averages to be less than the simple calculation of a product.

To account for the spectral smoothing, let w(t) be the theoretical shape of the time-domain window, where $t \in [t_0, t_0+T]$, $t_0$ is the beginning time of the acquisition, and $t_0+T$ is the end. Define $$c_k = \left|\frac{1}{T}\int_{t_0}^{t_0+T} w^2(t) e^{-j2\pi kt/T} dt\right|^2 \quad (31)$$

as the power of the Fourier series expansion of the square of the window function, with the observation that $c_0$ is the square of the average value of the square of the window curve.

For the commonly-used Hann window, $c_0 = 9/64 = 0.140625$, $c_1 = 1/16 = 0.0625$, $c_2 = 1/256 = 0.00390625$, and $c_k = 0$, for $k > 2$.

Let $H_i$, $i=0, 1, 2, \ldots, m-1$, denote the averaging weights used to perform the spectral smoothing. m is the number of spectral density points to be averaged together. In the two channel case, the mean cross spectral density $\overline{\hat{G}_{ab}}$ is smoothed to obtain a smoothed cross spectral density $V_{ab}$. Each point of the smoothed cross spectral density $V_{ab}$ may be computed by applying the averaging weights $H_i$ to a corresponding continuous band of uniformly-spaced frequency-adjacent complex points in the mean cross spectral density $\overline{\hat{G}_{ab}}$ and then summing the weighted complex points. In the one channel case, the mean power spectral density $\overline{\hat{G}_{aa}}$ is smoothed to obtain a smoothed power spectral density $V_{aa}$. Each point of the smoothed power spectral density $V_{aa}$ may be computed by applying the averaging weights $H_i$ to a corresponding continuous band of uniformly-spaced frequency-adjacent real-valued points in the mean power spectral density $\overline{\hat{G}_{aa}}$ and then summing the weighted points.

Define $$d_k = \begin{cases} \sum_{i=0}^{m-1} H_i^2, & k = 0 \\ 2\sum_{i=0}^{m-k-1} H_i H_{i+k}, & 0 < k < m \end{cases} \quad (32)$$

and $$a = \left(\sum_{i=0}^{m-1} H_i\right)^2. \quad (33)$$

Then the effective number of independent averages n'' produced by the frequency-domain (spectral) smoothing of the average of n' overlapped acquisitions is:

$$n'' = \frac{n'}{\left[\sum_{k=0}^{m-1}\left(\frac{c_k}{c_0}+1\right)\left(\frac{d_k}{a}\right)\right]-1}. \quad (34)$$

Depending on how many frequency points are used for smoothing, the improvement from n' to n'' can be quite helpful. For example, when the Hann time-domain window is used, along with a similar raised-cosine frequency-weighting shape for the smoothing, n" ranges from 2.5n' to 9.1n' as the number of smoothing points m ranges from 7 to 26. This speeds up the measurement by a factor of 2.5 to 9.1 or corresponds to a reduction in added uncorrelated bias of roughly 2.0 dB to 4.8 dB for cross-correlation measurements.

It is important to note that equation (34) holds only when the complex-valued function $\hat{G}_{ab}$ is smoothed. If the magnitude of $\hat{G}_{ab}$ is taken before smoothing, no cancellation of the uncorrelated noise will take place, and (34) does not apply. Magnitude smoothing will result in smoother-looking but less-accurate graphs than those from vector smoothing.

In some embodiments, the spectral smoothing is used to redistribute the spectral data from a linear scale to a log scale. Thus, the smoothing function $H=\{H_i\}$ may be different at each frequency location the smoothing function is applied. For example, the smoothing function may cover an extent in frequency that depends upon (e.g., is proportional to) the frequency point at which the function is applied. Because of this, the coefficient set $\{d_k\}$, the coefficient a and the effective number of averages n" may also be different at each frequency for which the smoothed spectral data is computed.

Error Bounds

For the case of a single-channel measurement, we can accurately estimate the uncertainty of $V_{aa}$. Likewise, for the case of a dual-channel measurement when there is little or no uncorrelated noise in each channel, we can accurately estimate the error bounds of $|V_{ab}|$. In both cases, equation (20) above gives a robust estimate for the 95.45% confidence bounds and is repeated here, using n" in place of n:

$$E_{95\%} = \pm 10\log\left(\frac{2}{\sqrt{n''-1}} + 1\right) \text{ dB.} \tag{35}$$

(In the case where the data sets are overlapped but spectral smoothing is not performed, the above-described number n' replaces n" in expression (35).) This approximation is accurate to within ±0.14 dB for n"≥1.7, and to within ±0.01 dB for n"≥18. Because of the cancellation in the denominator, the formula is not useful for n"=1, and so it is best to set n"=1.2 whenever n"<1.2. With that adjustment, the worst-case error for n"<1.7 is +2.0 dB at n"=1.2, where the expected error bound is ±11.4 dB and the formula conservatively estimates ±13.4 dB.

On the other hand, creating a useful estimate of the error in cross-spectral density measurements is not straightforward when there is a substantial amount of uncorrelated noise in each of the channels. The statistical distribution of the combination of all the terms of equation (12) becomes quite complicated, and the nature of the distribution changes as the number of averages increases.

Given an average $\overline{\hat{G}_{ab}}$ of n cross-spectral densities $\hat{G}_{ab}$, Bendat and Piersol offer the following error estimate for $|\overline{\hat{G}_{ab}}|$:

$$\sigma/\mu = \frac{1}{\hat{\gamma}_{ab}\sqrt{n}}, \tag{36}$$

where σ is the standard deviation of $|\overline{\hat{G}_{ab}}|$, where µ is the mean of $|\overline{\hat{G}_{ab}}|$, where $\hat{\gamma}_{ab}$ is the square root of the coherence function:

$$\hat{\gamma}_{ab}^2 = \frac{|\overline{\hat{G}_{ab}}|^2}{\overline{\hat{G}_{aa}}\overline{\hat{G}_{bb}}}. \tag{37}$$

(See Bendat, J. S., and Piersol, A. G., "Engineering Applications of Correlation and Spectral Analysis", Wiley-Interscience, New York, 1980, pages 71-77.)

Bendat and Piersol do not suggest spectral smoothing. However, if we re-interpret equation (36) in light of the above discussion of spectral smoothing, we can replace the n occurring in equation (36) with n":

$$\sigma/\mu = \frac{1}{\hat{\gamma}_{ab}\sqrt{n''}}. \tag{36*}$$

In this re-interpretation, the coherence function may be re-expressed as:

$$\hat{\gamma}_{ab}^2 = \frac{|V_{ab}|^2}{V_{aa}V_{bb}}, \tag{37*}$$

where $V_{aa}$ is the result of spectrally smoothing the mean $\overline{\hat{G}_{aa}}$, where $V_{bb}$ is the result of spectrally smoothing the mean $\overline{\hat{G}_{bb}}$.

The estimate (36) or (36*) suffers from several problems:

(a) The distributions are not normal (Gaussian), even when n" is large. Hence σ by itself does not indicate very well what the 95.45% bounds would be.

(b) When n"=1, $\hat{\gamma}_{ab}$ must also equal unity, and so must σ/µ. The true error, in fact, could be much higher if $G_{aa}$ and/or $G_{bb}$ are much larger than $|G_{ab}|$. This estimate of σ/µ remains erroneous for small values of n" other than unity but improves with larger values.

(c) Even for large values of n", the error estimate σ remains roughly the same if $V_{aa}$ and/or $V_{bb}$ are much larger than $|V_{ab}|$, no matter how much larger they actually are, and so σ is not very helpful.

The following metric is offered, which for the most part corrects (a) and (b) and offers some improvement in (c).

Let $$S = 10\log\sqrt{\frac{n''}{\frac{1}{\hat{\gamma}_{ab}^2}-1+e^{(1-n'')/20}}}, \tag{38}$$

where $\hat{\gamma}_{ab}$ is defined in equation (37*). S is, in a sense, a signal-to-noise ratio metric which compares the correlated noise to the uncorrelated noise and corrects for the effective number of averages taken. The exponential term prevents S from producing a falsely-optimistic estimate when n" is low. Next, define $$T=10^{(0.81-0.1S+2000S^{-6})}. \tag{39}$$

T converts the signal-to-noise metric S into an approximation (in dB) of contribution of the uncorrelated noise to the 95.45% error bound. The large $S^{-6}$ term partially compensates for the tendency to underestimate the error when little is known of the signal and the correlated noise is much larger than the uncorrelated noise. This mostly affects error estimates greater than ±3 dB. Finally, define $$A = 10\log\left(\frac{2}{\sqrt{n''-1}} + 1\right), \qquad (40)$$

which is the same as equation (35) and accounts for the uncertainty in the averaged correlated data $|V_{yy}|$, where $V_{yy}$ represents the result that would be obtained by spectrally smoothing the mean power spectral density $\overline{G}_{yy}$. As before, n" should be bounded to $\geq 1.2$.

Then the estimated 95.45% confidence error metric is:

$$E_{95\%} = \pm\sqrt[3]{A^2 + T^2} \text{dB}. \qquad (41)$$

This estimate will be referred to herein as EM (where EM stands for Error Metric).

Figure 5:
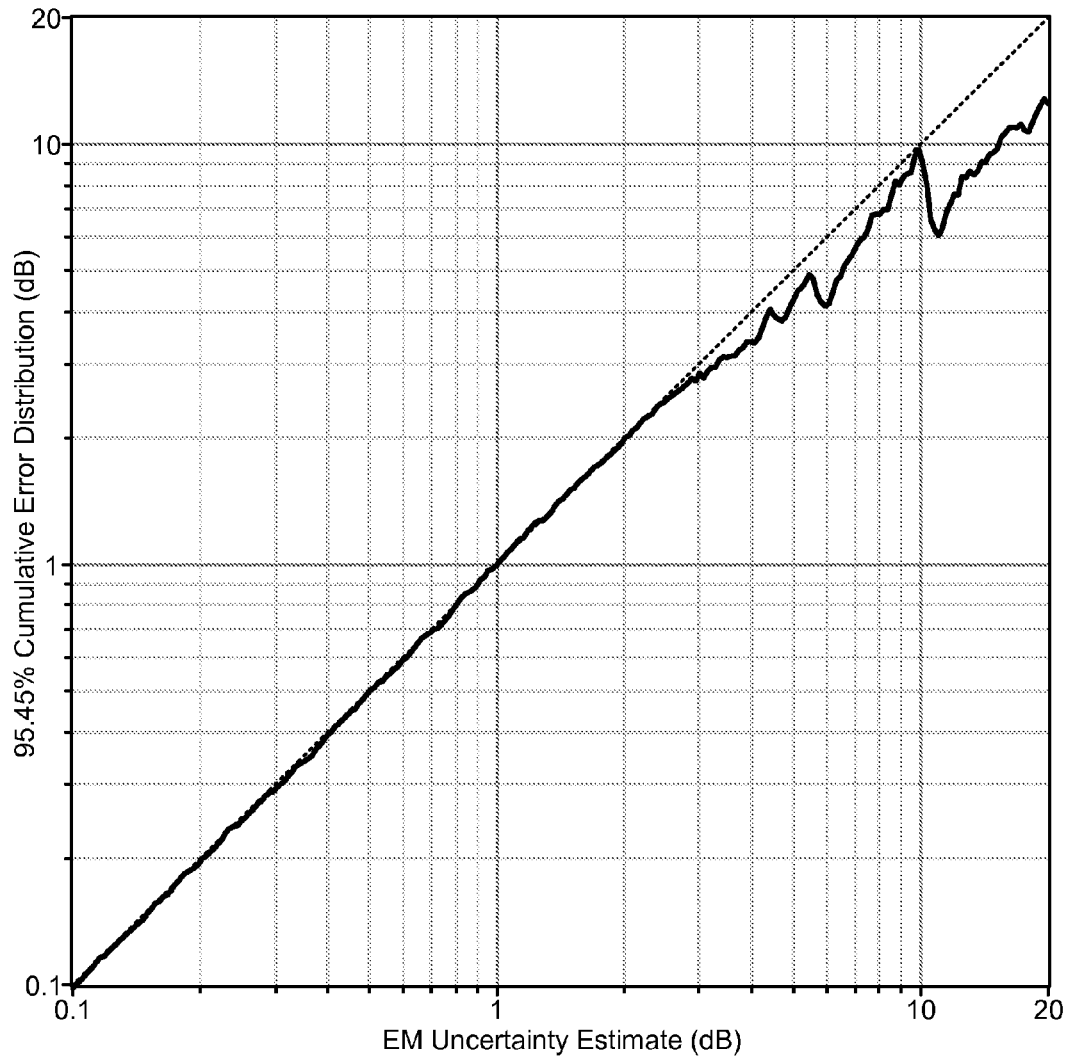
FIG. 5 is a graph of actual 95.45% simulation results vs. the EM uncertainty estimate. (See equation (41) for a definition of the EM uncertainty estimate.) (The dotted line depicts ideal performance.)

EM has been tested for accuracy. FIG. 5 illustrates the results of a simulation wherein 675000 sets of random correlation data were produced, with the number of averages ranging randomly from 1 to 50000 and the ratio of the uncorrelated power to correlated power in each channel ranging randomly from −20 dB to +30 dB. The X-axis is the EM 95% confidence metric in dB, and the Y-axis represents the 95.45% cumulative probability distribution of simulation results having the corresponding X-axis EM estimate. The ideal error metric would produce a straight diagonal line, as shown by the dotted line in FIG. 5.

FIG. 5 shows that EM is very robust when the error is less than 3 dB. Above 3 dB, the estimate departs to the low side of the ideal curve, indicating somewhat conservative estimates. Were it not for the $S^{-6}$ term, it would branch considerably higher than the ideal curve, producing falsely lower error estimates.

It is emphasized that EM results above 3 dB are somewhat unreliable. When EM indicates less than 3 dB, the error distributions are fairly predictable, but for EM above 3 dB, the distributions vary considerably. And while EM does a fairly good job of estimating the 95.45% error bound above 3 dB, it does not indicate how large the remaining 4.55% of the errors might be. Indeed, some of the simulated errors exceeded 20 dB in this region.

The estimate EM is based on a 95% confidence probability. However, the principles described herein generalize to any confidence probability.

In some embodiments, the estimate EM may be determined without spectral smoothing but with overlapping of sample data sets. In this case, when determining S and A, the coherence measure of expression (37) is used instead of the coherence measure of expression (37*), and the effective number n' is used instead of the effective number n". In some embodiments, the estimate EM may be determined without spectral smoothing and without overlapping of sample data sets. In this case, when determining S and A, the coherence measure of expression (37) is used instead of the coherence measure of expression (37*), and n is used instead of the effective number n".

Method 600

In one set of embodiments, a method 600 for estimating a power spectral density of a target noise signal may include the operations shown in FIG. 6A. (Method 600 may also include any subset of the features, embodiments and operations described above.) The method 600 involves vector smoothing, i.e., smoothing a complex-valued mean cross-spectral density in the frequency domain. Method 600 may be performed using a computational device as described above.

Action 610 may include performing n iterations of a set of operations in order to obtain n corresponding complex-valued cross spectral densities between a signal a(t) from a first channel and a signal b(t) from a second channel, e.g., as described above. The signal a(t) is a sum of a first interfering noise signal and the target noise signal; the signal b(t) is a sum of a second interfering noise signal and the target noise signal. The integer n is greater than one. The set of operations may include: (1) acquiring a set of samples of the signal a(t); (2) acquiring a set of samples of the second signal b(t), where the set of samples of the signal a(t) and the set of samples of the signal b(t) are acquired simultaneously (i.e., in parallel); and (3) computing a complex-valued cross spectral density between the sample set of the signal a(t) and the sample set of the signal b(t).

The integer n may reside in different ranges in different embodiments, or in different circumstances. In various circumstances, n may be, respectively, greater than 10, greater than 100, greater than 1000, greater than 10000, greater than 100,000, greater than $10^6$. In some embodiments, the integer n may be determined by user input.

Action 620 may include averaging the n complex-valued cross spectral densities to obtain a complex-valued averaged cross spectral density. In some embodiments, the average is an equally-weighted average. In other embodiments, different ones of the cross spectral densities may be weighted differently.

Action 630 includes smoothing the complex-valued averaged cross spectral density in the frequency domain to obtain a complex-valued smoothed cross spectral density, e.g., as described above. The estimate of the power spectral density $G_{yy}$ of the target noise signal is based on the complex-valued smoothed cross spectral density. The estimate of $G_{yy}$ may be determined by computing the magnitude of the smoothed cross spectral density.

Action 640 may include storing the estimate of the power spectral density of the target noise signal in a memory, e.g., a memory of the computational device, or a memory residing elsewhere, e.g., in a host computer.

In some embodiments, the filter used to perform the smoothing varies with frequency, e.g., as described above.

Figure 1B:
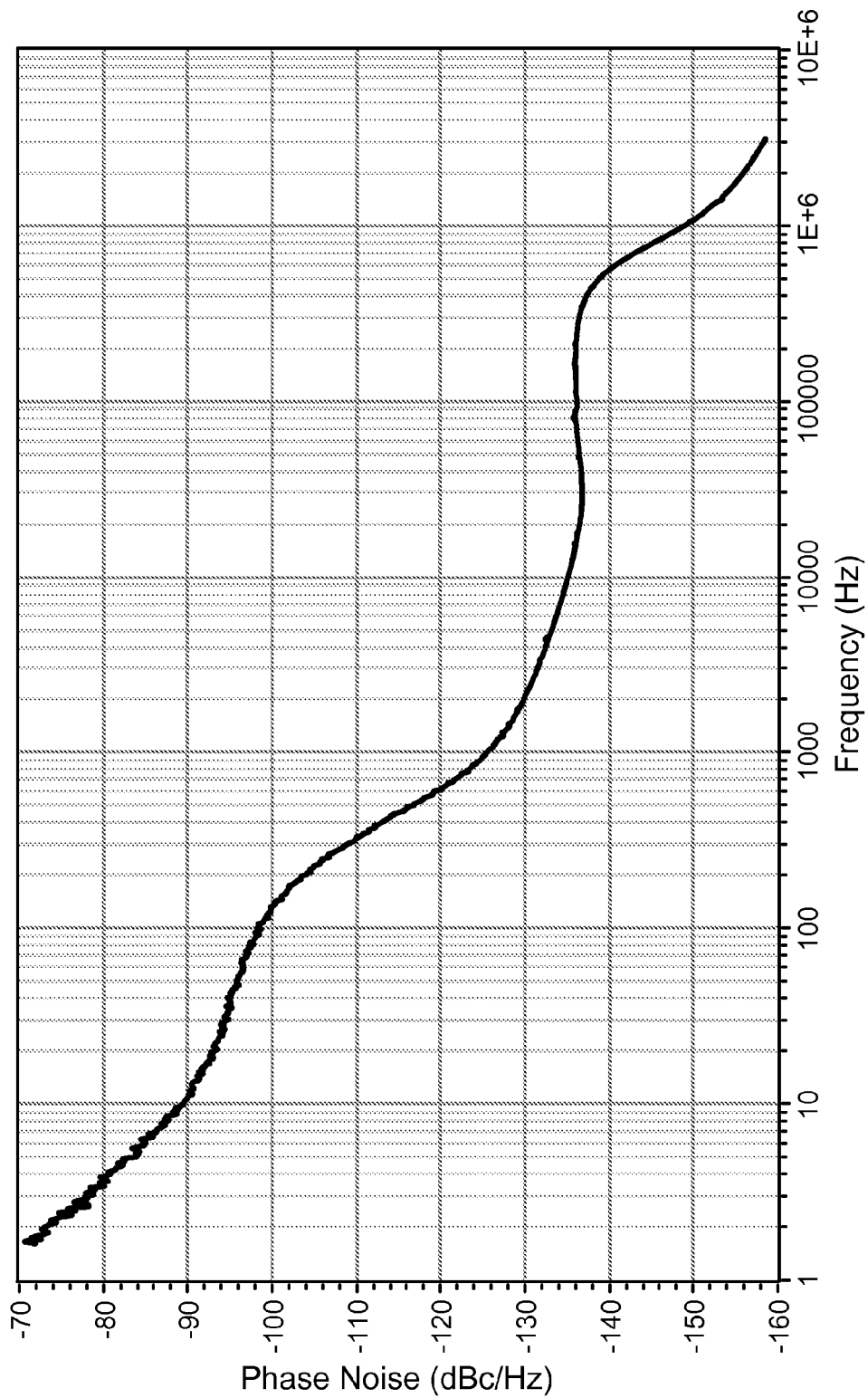
FIG. 1B is a graph of the power spectral density of the phase noise of an SMA100A signal generator at 800 MHz.

In some embodiments, the method 600 may also include displaying the estimate of the power spectral density of the target noise signal as a graph, e.g., as shown in FIG. 1A or 1B. In some embodiments, method 600 may be applied to each product in an assembly line, to uniquely characterize the noise generated by each product. The power spectral density estimate might be stored in a memory medium and provided to a customer along with the product.

The target noise signal y(t) may conform to any of various kinds of noise. In some embodiments, the target noise signal y(t) may be a phase noise signal. In other embodiments, the target noise signal y(t) may be a voltage noise signal. In yet other embodiments, the target noise signal y(t) may be a current noise signal. In yet other embodiments, the target noise signal y(t) may be an optical noise signal. In yet other embodiments, the target noise signal y(t) may be a displacement noise signal.

In some embodiments, the action of averaging the n complex-valued cross-spectral densities comprises computing an updated average after each iteration of the set of operations, e.g., according to the relations:

$$\text{SUM}(m) = \text{SUM}(m-1) + \hat{G}_{ab}^{(m)} \qquad (42\text{A})$$

$$\text{AVG}(m) = (1/m)*\text{SUM}(m), \qquad (42\text{B})$$

where $\hat{G}_{ab}^{(m)}$ represents an $m^{th}$ of the cross spectral densities. In these embodiments, the smoothing may be performed on each updated average to obtain a corresponding smoothed cross spectral density. The magnitude of each smoothed cross spectral density may be displayed in succession so that a user can visualize how the uncertainty in the power spectral density decreases as the number of averages increases.

In some embodiments, successive sets of the samples of the signal a(t) are overlapping in time, and successive sets of the samples of the signal b(t) are overlapping in time, e.g., as described above.

In some embodiments, the set of operations includes: applying a time-domain window to the sample set of the signal a(t) to obtain a first windowed sample set; and applying the time domain window to the sample set of the signal b(t) to obtain a second windowed sample set. See the above discussion regarding time-domain windowing. The action of computing the complex-valued cross spectral density between the sample set of the signal a(t) and the sample set of the signal b(t) comprises computing a complex-valued cross spectral density between the first windowed sample set and the second windowed sample set.

Method 650

In one set of embodiments, a method 650 for estimating a power spectral density of a target noise signal may include the actions shown in FIG. 6B. (Method 650 may also include any subset of the features, embodiments and operations described above.) Method 650 may be performed using a computational device as described above.

Action 655 may include smoothing a complex-valued averaged cross spectral density to obtain a complex-valued smoothed cross spectral density, e.g., as variously described above. The complex-valued averaged cross spectral density is an average of n complex-valued cross spectral densities, e.g., as variously described above. (The integer n is greater than one.) Each of the n complex-valued cross spectral densities is computed based on a corresponding one of n two-channel acquisitions, where each of the two-channel acquisitions includes an acquisition of a set of samples of a signal a(t) from a first channel and a simultaneous acquisition of a set of samples of a signal b(t) from a second channel, e.g., as variously described above. The signal a(t) is a sum of a first interfering noise signal and the target noise signal; the signal b(t) is a sum of a second interfering noise signal and the target noise signal.

Action 660 may include determining an estimate of the power spectral density of the target noise signal based on the complex-valued smoothed cross spectral density, e.g., as variously described above. The estimate of the power spectral density of the target noise signal is stored in a memory, e.g., a memory of the computational device.

In some embodiments, the filter used to perform the smoothing varies with frequency, e.g., as described above.

In some embodiments, the method 650 may also include displaying the estimate of the power spectral density of the target noise signal as a graph.

The target noise signal y(t) may conform to any of various kinds of noise. In some embodiments, the target noise signal y(t) may be a phase noise signal. In other embodiments, the target noise signal y(t) may be a voltage noise signal. In yet other embodiments, the target noise signal y(t) may be a current noise signal. In yet other embodiments, the target noise signal y(t) may be an optical noise signal. In yet other embodiments, the target noise signal y(t) may be a displacement noise signal.

In some embodiments, the successive sets of samples of the signal a(t) are overlapping in time, and the successive sets of the samples of the signal b(t) are overlapping in time, e.g., as variously described above.

In some embodiments, for each of the n two-channel acquisitions, the sample set of the signal a(t) is windowed with a time domain window to obtain a first windowed sample set, and the sample set of the signal b(t) is windowed with the time domain window to obtain a second windowed sample set, e.g., as variously described above. Each of the n complex-valued cross spectral densities is based on the first windowed sample set and the second windowed sample set of the corresponding two-channel acquisition, e.g., as variously described above.

In some embodiments, the method 650 also includes averaging the n complex-valued cross spectral densities to obtain the complex-valued averaged cross spectral density, e.g., as variously described above. The averaging may include computing an updated average after each of the n two-channel acquisitions, e.g., as variously described above.

Method 700

In one set of embodiments, a method 700 may include the operations shown in FIG. 7A. (Method 700 may also include any subset of the features, embodiments and operations described above.) Method 700 may be performed using a computational device as described above.

Action 710 may include determining a statistical error bound for an estimate of a power spectral density of a target noise signal y(t), e.g., as variously described above. The power spectral density estimate may be determined by averaging n complex-valued cross spectral densities to obtain a complex-valued averaged cross spectral density. The magnitude of the complex-valued averaged cross spectral density may be used as the power spectral density estimate for the target noise signal. The n complex-valued cross spectral densities are computed based on n respective two-channel data sets. (Each of the n complex-valued cross spectral densities may be computed in the traditional manner using Fourier transforms. However, it is noted that there are other means for computing cross spectral densities besides strict Fourier transforms, and the metrics and bounds described herein will apply to those other means as well.) Each two-channel data set includes a set of samples of a signal a(t) acquired from a first channel and a corresponding set of samples of a signal b(t) acquired from a second channel. Each set of samples of the signal a(t) and the corresponding set of samples of the second signal b(t) are acquired over the same interval of time. The signal a(t) is a sum of a first interfering noise signal and the target noise signal y(t). The signal b(t) is a sum of a second interfering noise signal and the target noise signal y(t).

The action of determining the statistical error bound may include computing the statistical error bound based on an expression of the form $\sqrt{A^2+T^2}$, where A depends on the number n, where T depends on the number n and a coherence function associated with the complex-valued averaged cross spectral density. For example, one may compute A and T using expressions (37) and (38) through (40), but with n replacing n". Other cases will be discussed below.

It is noted that the statistical error bound is a function of frequency at least because the coherence function is a function of frequency. See equations (37) and (37*).

Action 720 includes storing the statistical error bound in a memory, e.g., a memory of the computational device.

The term "statistical error bound" implies that the power spectral density of the target noise signal has a given probability P of being within the interval of radius B centered on the power spectral density estimate, where B is the statistical error bound. The probability P may be different in different embodiments. In some embodiments, the probability P may be determined by user input.

In some embodiments, the action of determining the statistical error bound includes computing an effective number of independent averages n' corresponding to the power spectral density estimate based on data including the number n and a relative amount of time overlap between successive ones of the sample sets of the signal a(t) and between successive ones of the sample sets of the signal b(t). In these embodiments, A depends on the effective number n', and T depends on the effective number n' and the coherence function. For example, one may compute A and T using expression (37) and expressions (38) through (40), but with n' replacing n".

In some embodiments, the action of determining the power spectral density estimate includes spectrally smoothing the complex-valued averaged cross spectral density to obtain a spectrally smoothed cross spectral density, e.g., as described above. (The magnitude of the spectrally smoothed cross spectral density may used as the power spectral density estimate.) In these embodiments, the action of determining the statistical error bound may include computing an effective number of independent averages n" corresponding to the power spectral density estimate based on data including: (1) the number n; (2) information specifying a time-domain window that is applied to the sample sets of the signal a(t) and to the sample sets of the signal b(t); and (3) information specifying the filter used to perform said spectral smoothing. (The effective number n" may be computed, e.g., as described above in connection with equation (34).) Furthermore, A depends on the effective number n", and T depends on the effective number n" and on a coherence function associated with the spectrally smoothed cross spectral density. For example, one may use expressions (37*) and (38) through (40) to compute A and T.

In some embodiments, the data used to compute the effective number n" may also include a relative amount of time overlap between successive ones of the sample sets of the signal a(t) and between successive ones of the sample sets of the signal b(t), e.g., as described above.

In some embodiments, the filter used to perform the spectral smoothing varies with frequency, e.g., as described above in the section entitled "Spectral Smoothing". In some embodiments, the spectral smoothing redistributes the complex-valued averaged cross spectral density from a linear frequency scale to a logarithmic frequency scale.

In some embodiments, the method 700 may also include displaying a graph of the estimate of the power spectral density of the target noise signal y(t). Furthermore, a graphical indication of the statistical error bound may be displayed in association with the graph of the power spectral density estimate. For example, the graphical indication may be a set of one or more error bars that are superimposed and/or centered on the graph of the power spectral density estimate at one or more respective frequency locations. The size of the error bars correspond to the magnitude of the statistical error bound at the corresponding frequency locations.

In one alternative embodiment, the graphical indication of the statistical error bound includes a graph of an upper bound function and a graph of a lower bound function, where the upper bound function is the power spectral density estimate plus the statistical error bound, and the lower bound function is the power spectral density estimate minus the statistical error bound.

The target noise signal y(t) may conform to any of various kinds of noise. In some embodiments, the target noise signal y(t) may be a phase noise signal. In other embodiments, the target noise signal y(t) may be a voltage noise signal. In yet other embodiments, the target noise signal y(t) may be a current noise signal. In yet other embodiments, the target noise signal y(t) may be an optical noise signal. In yet other embodiments, the target noise signal y(t) may be a displacement noise signal.

Method 800

In one set of embodiments, a method 800 may include the operations shown in FIG. 7B. (Method 800 may also include any subset of the features, embodiments and operations described above.) Method 800 may be performed using a computational device as described above.

Action 810 may include determining a measure of uncertainty for an estimate of a power spectral density of a noise signal. The power spectral density estimate may be determined by computing an average of n power spectral densities derived from n respective sets of samples of the noise signal. Each of the n power spectral densities is computed based on a corresponding one of the sample sets. (Each of the n power spectral densities may be computed in the traditional manner using a Fourier transform. However, it is noted that there are other means for computing power spectral densities besides strict Fourier transforms, and the metrics and uncertainty measures described herein will apply to those other means as well.)

The action of determining the uncertainty measure may include computing the uncertainty measure based on the number n. For example, the uncertainty measure may be computed as described above in connection with expression (20). Other examples will be described below.

Action 820 may include storing the uncertainty measure in a memory.

In some embodiments, the method 800 may also include displaying a graph of the estimate of the power spectral density of the noise signal. Furthermore, a graphical indication of the uncertainty measure may be displayed in association with the displayed graph, e.g., as variously described above.

In some embodiments, the action of determining the uncertainty measure includes computing an effective number of independent averages n' corresponding to the power spectral density estimate based on data including: the number n and a relative amount of overlap between successive ones of the n sample sets, e.g., as described above. The uncertainty measure may then be computed based on the effective number n'.

In some embodiments, the action of determining the power spectral density estimate includes spectrally smoothing the average of the n power spectral densities to obtain a spectrally smoothed power spectral density (e.g., as described above in the section entitled "Spectral Smoothing"). In this case, the action of determining the uncertainty measure may include computing an effective number of independent averages n" corresponding to the power spectral density estimate based on data including: (a) the number n; (b) information specifying a time-domain window that is applied to each of the n sample sets; and (c) information specifying the filter used to perform the spectral smoothing. The uncertainty measure may then be computed based on the effective number n", e.g., as described above in connection with expression (35).

In some embodiments, the data used to compute the effective number n" may also include a relative amount of overlap between successive ones of the n sample sets.

The target noise signal y(t) may conform to any of various kinds of noise. In some embodiments, the target noise signal y(t) may be a phase noise signal. In other embodiments, the target noise signal y(t) may be a voltage noise signal. In yet other embodiments, the target noise signal y(t) may be a current noise signal. In yet other embodiments, the target noise signal y(t) may be an optical noise signal. In yet other embodiments, the target noise signal y(t) may be a displacement noise signal.

Note that the metric given above in expression (41) specifies a statistical error range, i.e., both an upper bound and lower bound, so that the actual noise density (of the target noise signal) is within the error range with given probability (e.g., P=95%). In alternative embodiments, instead of calculating an error range only an upper bound is calculated, where the actual noise density is lower than the estimated upper bound with probability equal to or greater than P (e.g., P=95%). This upper bound is significantly lower than the upper bound provided by the expression (41), especially when the data is poorly resolved, which happens when the interfering noise is greater than the target noise (the noise to be measured). This alternative metric is useful in production test applications, where knowing the exact noise density is not as important as knowing that the noise density is simply below some given amount, say, a test limit. It can significantly decrease the amount of time required to test a product: one can stop accumulating acquisitions when the upper bound falls below an established limit.

In one embodiment, the statistical upper bound is given by:

$$(G_{yy})_{UB} = \left(\frac{\sqrt{V_{aa}V_{bb}}}{n''}\sqrt{1+\frac{\pi}{4}(n''-1)} + |V_{ab}|\right)\left(\frac{1}{\sqrt{n''-1}}+1\right) \quad (43)$$

where $V_{aa}$, $V_{bb}$, $V_{ab}$ and n'' are as defined above, where $$G_{yy} \leq (G_{yy})_{UB} \quad (44)$$

with probability greater than or equal to 95%. Thus, the statistical upper bound is a product of two terms, one depending on n'' and the other depending on n'', $V_{aa}$, $V_{bb}$ and $V_{ab}$.

If spectral smoothing is not performed, then $V_{aa}$, $V_{bb}$, $V_{ab}$ and n'' are replaced by $\tilde{G}_{aa}$, $\tilde{G}_{bb}$, $\tilde{G}_{ab}$ and n' (or n if successive sample sets are not overlapped).

The statistical upper bound (43) assumes that the power spectral density estimate for the target noise signal y(t) is based on two-channel acquisitions. However, as described above, a power spectral density estimate for the total noise signal (i.e., the sum of the target noise signal plus any interfering noise signal) may be computed based on single-channel acquisitions. A statistical upper bound for this case may be computed based on the expression:

$$(G_{aa})_{UB} = V_{aa}\left(\frac{1}{\sqrt{n''-1}}+1\right), \quad (45)$$

where $V_{aa}$ and n'' are as defined above, where $$G_{aa} \leq (G_{aa})_{UB} \quad (46)$$

with probability greater than or equal to 95%. If spectral smoothing is not performed, then $V_{aa}$ and n'' are replaced by $\tilde{G}_{aa}$ and n' (or n if successive sample sets are not overlapped).

Method 850

In one set of embodiments, a method 850 may include the operations shown in FIG. 8. (Method 850 may also include any subset of the features, embodiments and operations described above.) Method 850 may be performed using a computational device as described above.

Action 855 may include determining a statistical upper bound (e.g., as described above) for an estimate of a power spectral density of a target noise signal y(t). The estimate of the power spectral density is determined by averaging n complex-valued cross spectral densities to obtain a complex-valued averaged cross spectral density. The n complex-valued cross spectral densities are computed based on n respective two-channel data sets. (Each of the n complex-valued cross spectral densities may be computed in the traditional manner using Fourier transforms. However, it is noted that there are other means for computing cross spectral densities besides strict Fourier transforms, and the metrics and bounds described herein will apply to those other means as well.) Each two-channel data set includes a set of samples of a signal a(t) acquired from a first channel and a corresponding set of samples of a signal b(t) acquired from a second channel. Each set of samples of the signal a(t) and the corresponding set of samples of the second signal b(t) are acquired over the same interval of time. The signal a(t) is a sum of a first interfering noise signal and the target noise signal y(t). The signal b(t) is a sum of a second interfering noise signal and the target noise signal y(t).

The action of determining the statistical upper bound may include computing the statistical upper bound based on the number n, the complex-valued averaged cross spectral density, a first spectral density and a second spectral density, where the first spectral density is an averaged power spectral density for the signal a(t), where the second spectral density is an averaged power spectral density for the signal b(t). For example, the statistical upper bound may be computed as indicated by expression (43), but with n replacing n'' and with $\overline{G}_{aa}$, $\overline{G}_{bb}$, $\overline{G}_{ab}$ replacing $V_{aa}$, $V_{bb}$ and $V_{ab}$. Other examples are discussed below.

Action 870 may include storing the statistical upper bound in a memory.

In some embodiments, the method 850 may also include: displaying a graph of the estimate of the power spectral density of the target noise signal y(t); and displaying the statistical upper bound in association with the graph, e.g., as variously described above.

In some embodiments, the action of determining the statistical upper bound includes computing an effective number of independent averages n' corresponding to the power spectral density estimate based on data including: the number n and a relative amount of time overlap between successive ones of the sample sets of the signal a(t) and between successive ones of the sample sets of the signal b(t). The statistical upper bound may then be computed based on the effective number n', the complex-valued averaged cross spectral density, the first spectral density and the second spectral density (e.g., as indicated by the expression (43), but with n' replacing n'' and with $\overline{G}_{aa}$, $\overline{G}_{bb}$, $\overline{G}_{ab}$ replacing $V_{aa}$, $V_{bb}$ and $V_{ab}$).

In some embodiments, the action of determining the power spectral density estimate includes spectrally smoothing the complex-valued averaged cross spectral density to obtain a spectrally smoothed cross spectral density. (The magnitude of the spectrally smoothed cross spectral density may be used as the power spectral density estimate.) In this case, the action of determining the statistical upper bound may include computing an effective number of independent averages n'' corresponding to the power spectral density estimate based on data including: (a) the number n; (b) information specifying a time-domain window that is applied to the sample sets of the signal a(t) and to the sample sets of the signal b(t); and (c) information specifying the filter used to perform the spectral smoothing. The statistical upper bound may then be computed based on the effective number n'', the spectrally smoothed cross spectral density, and spectrally smoothed versions of the first and second spectra, e.g., as indicated by expression (43).

In some embodiments, the filter used to perform the spectral smoothing varies with frequency, e.g., as described above.

In some embodiments, the spectral smoothing redistributes the complex-valued averaged cross spectral density from a linear frequency scale to a logarithmic frequency scale.

In some embodiments, the target noise signal y(t) is a phase noise signal or a voltage noise signal or a current noise signal or an optical noise signal or a displacement noise signal.

In some embodiment, the statistical upper bound is computed based on the expression:

$$(G_{yy})_{UB} = \left(\frac{\sqrt{V_{aa}V_{bb}}}{n''}\sqrt{1+\frac{\pi}{4}(n''-1)} + |V_{ab}|\right)\left(\frac{1}{\sqrt{n''-1}}+1\right),$$

where n" is the effective number of averages.

Computer System

Figure 9:
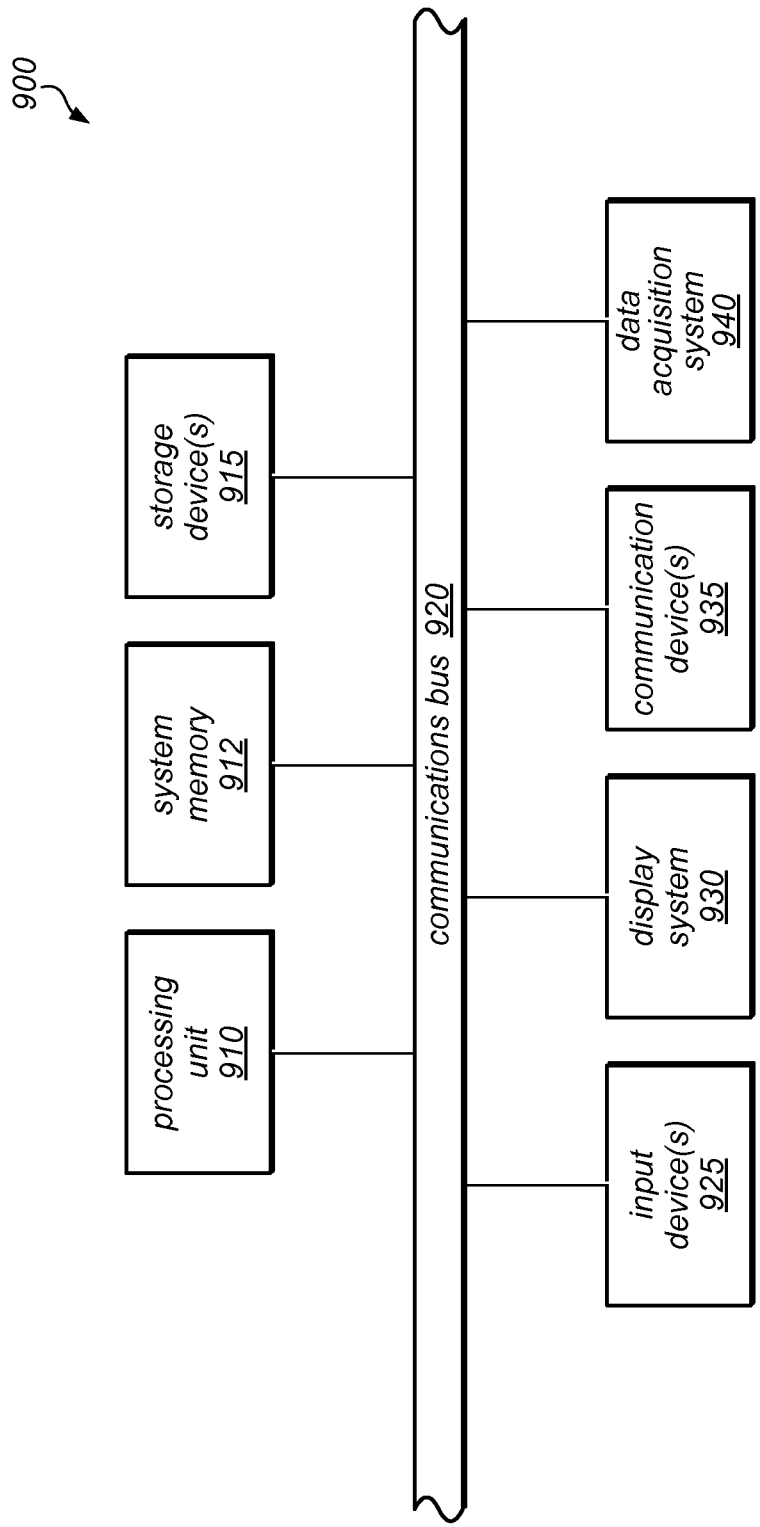
FIG. 9 illustrates one embodiment of a computer system 900 that may be used to perform any the method embodiments described herein.

FIG. 9 illustrates one embodiment of a computer system 900 that may be used to perform any of the method embodiments described herein, or, any combination of the method embodiments described herein, or any subset of any of the method embodiments described herein, or, any combination of such subsets.

Computer system 900 may include a processing unit 910, a system memory 912, a set 915 of one or more storage devices, a communication bus 920, a set 925 of input devices, and a display system 930.

System memory 912 may include a set of semiconductor devices such as RAM devices (and perhaps also a set of ROM devices).

Storage devices 915 may include any of various storage devices such as one or more memory media and/or memory access devices. For example, storage devices 915 may include devices such as a CD/DVD-ROM drive, a hard disk, a magnetic disk drive, magnetic tape drives, etc.

Processing unit 910 is configured to read and execute program instructions, e.g., program instructions stored in system memory 912 and/or on one or more of the storage devices 915. Processing unit 910 may couple to system memory 912 through communication bus 920 (or through a system of interconnected busses). The program instructions configure the computer system 900 to implement a method, e.g., any of the method embodiments described herein, or, any combination of the method embodiments described herein, or, any subset of any of the method embodiments described herein, or any combination of such subsets.

Processing unit 910 may include one or more processors (e.g., microprocessors).

One or more users may supply input to the computer system 900 through the input devices 925. Input devices 925 may include devices such as a keyboard, a mouse, a touch-sensitive pad, a touch-sensitive screen, a drawing pad, a track ball, a light pen, a data glove, eye orientation and/or head orientation sensors, a microphone (or set of microphones), or any combination thereof.

The display system 930 may include any of a wide variety of display devices representing any of a wide variety of display technologies. For example, the display system may be a computer monitor, a head-mounted display, a projector system, a volumetric display, or a combination thereof. In some embodiments, the display system may include a plurality of display devices. In one embodiment, the display system may include a printer and/or a plotter.

In some embodiments, the computer system 900 may include other devices, e.g., devices such as one or more graphics accelerators, one or more speakers, a sound card, a video camera and a video card.

In some embodiments, computer system 900 may include one or more communication devices 935, e.g., a network interface card for interfacing with a computer network.

In some embodiments, the communication devices may include a reconfigurable I/O (RIO) board that includes one or more programmable hardware elements (PHEs), one or more A/D converters and perhaps additional circuitry. The RIO board is programmable to achieve a user-desired configuration of input and/or output processing, e.g., via a program written using LabVIEW FPGA. In some embodiments, the reconfigurable I/O board is one of the RIO boards provided by National Instruments Corporation.

The computer system may be configured with a software infrastructure including an operating system, one or more compilers for one or more corresponding programming languages, and perhaps also one or more graphics APIs (such as OpenGL®, Direct3D, Java 3D™). Any or all of the compilers may be configured to perform expression rearrangement according to any or all of the method embodiments described herein. In some embodiments, the software infrastructure may include LabVIEW and/or LabVIEW FPGA, which are software products of National Instruments Corporation.

In some embodiments, the computer system 900 may be configured for coupling to a data acquisition system 940. The data acquisition system 940 is configured to receive analog inputs signals, to digitize the analog input signals, and to make those digitized signals available to the computer system 900. The data acquisition system 940 may operate under the control of the software executing on processor 910. In some embodiments, the data acquisition system 940 includes two A/D converters that are configured to capture samples of two input signals in parallel, e.g., driven by the same sample conversion clock. The captured samples may be stored into a memory of the data acquisition system 940 and made available for access by host software executing on processing unit 910.

Figure 10:
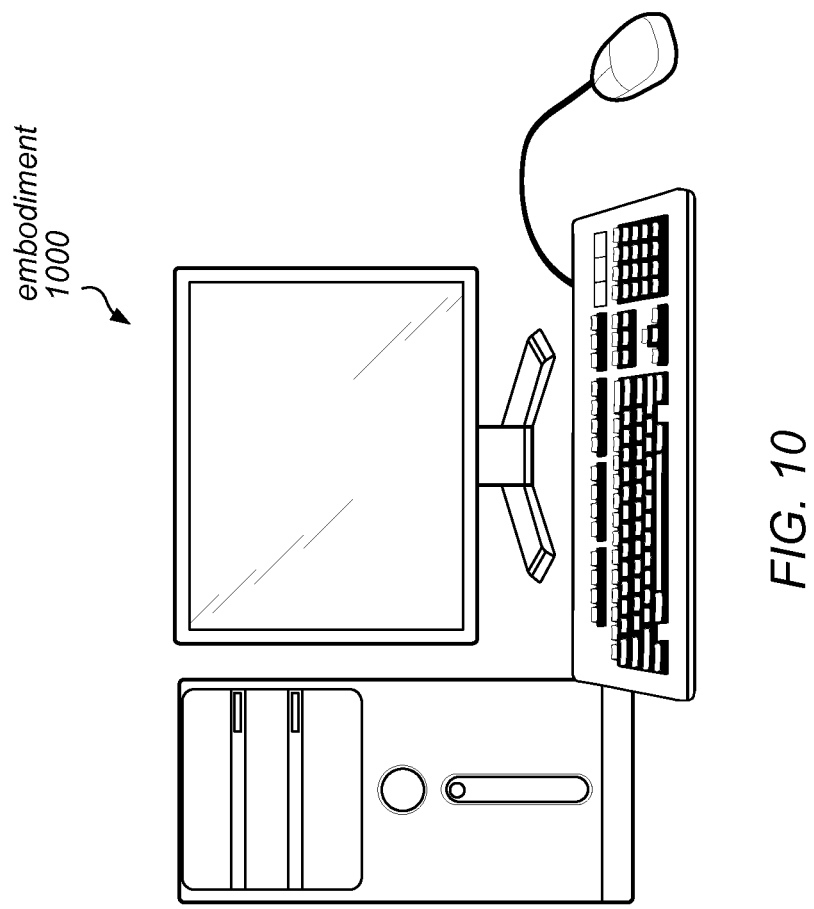
FIG. 10 illustrates an embodiment 1000 of the computer system 900.

FIG. 10 illustrates one possible embodiment 1000 for computer system 900.

What is claimed is:

1. A method comprising:

acquiring n two-channel data sets and storing the n two-channel data sets in a memory, wherein for each two-channel data set said acquiring comprises:

acquiring a set of samples of a signal a(t) from a first channel, wherein the signal a(t) is a sum of a first interfering noise signal and a target noise signal y(t);

acquiring a set of samples of a signal b(t) from a second channel, wherein the signal b(t) is a sum of a second interfering noise signal and the target noise signal y(t), wherein the sample set of the signal a(t) and the sample set of the signal b(t) are acquired over the same interval of time;

utilizing a computational device to implement:

determining a statistical error bound for an estimate of a power spectral density of a target noise signal y(t), wherein the estimate is determined by averaging n complex-valued cross spectral densities to obtain a complex-valued averaged cross spectral density, wherein the n complex-valued cross spectral densities are computed based respectively on the n two-channel data sets, wherein said determining the statistical error bound includes computing the statistical error bound based on an expression of the form $\sqrt{A^2+T^2}$, wherein A depends on the number n, wherein T depends on the number n and a coherence function associated with the complex-valued averaged cross spectral density;

storing the statistical error bound in a memory.

2. The method of claim 1, further comprising:
displaying a graph of the estimate of the power spectral density of the target noise signal y(t); and
displaying a graphical indication of the statistical error bound in association with the graph.

3. The method of claim 1, wherein said determining the statistical error bound includes computing an effective number of independent averages corresponding to said power spectral density estimate based on data including the number n and a relative amount of time overlap between successive ones of the sample sets of the signal a(t) and between successive ones of the sample sets of the signal b(t), wherein A depends on the effective number, wherein T depends on the effective number and the coherence function.

4. The method of claim 1, wherein said determining the power spectral density estimate includes spectrally smoothing the complex-valued averaged cross spectral density to obtain a spectrally smoothed cross spectral density, wherein said determining the statistical error bound includes computing an effective number of independent averages corresponding to said power spectral density estimate based on data including: the number n; information specifying a time-domain window that is applied to the sample sets of the signal a(t) and to the sample sets of the signal b(t); and information specifying the filter used to perform said spectral smoothing, wherein A depends on the effective number, wherein T depends on the effective number and on a coherence function associated with the spectrally smoothed cross spectral density.

5. The method of claim 4, wherein the filter used to perform the spectral smoothing varies with frequency.

6. The method of claim 5, wherein the spectral smoothing redistributes the complex-valued averaged cross spectral density from a linear frequency scale to a logarithmic frequency scale.

7. A system comprising:
a memory configured to store program instructions; and
a processor configured to access the program instructions from the memory and execute the program instructions, wherein the program instructions, when executed by the processor, cause the processor to implement:
determining a statistical error bound for an estimate of a power spectral density of a target noise signal y(t), wherein the estimate is determined by averaging n complex-valued cross spectral densities to obtain a complex-valued averaged cross spectral density, wherein the n complex-valued cross spectral densities are computed based on n respective two-channel data sets, wherein each two-channel data set includes a set of samples of a signal a(t) acquired from a first channel and a corresponding set of samples of a signal b(t) acquired from a second channel, wherein each set of samples of the signal a(t) and the corresponding set of samples of the second signal b(t) are acquired over the same interval of time, wherein the signal a(t) is a sum of a first interfering noise signal and the target noise signal y(t), wherein the signal b(t) is a sum of a second interfering noise signal and the target noise signal y(t), wherein said determining the statistical error bound includes computing the statistical error bound based on an expression of the form $\sqrt{A^2+T^2}$, wherein A depends on the number n, wherein T depends on the number n and a coherence function associated with the complex-valued averaged cross spectral density;

storing the statistical error bound in a memory medium.

8. The system of claim 7, wherein the program instructions, when executed by the processor, further cause the processor to implement:
displaying a graph of the estimate of the power spectral density of the target noise signal y(t); and
displaying a graphical indication of the statistical error bound in association with the graph.

9. The system of claim 7, wherein said determining the statistical error bound includes computing an effective number of independent averages corresponding to said power spectral density estimate based on data including the number n and a relative amount of time overlap between successive ones of the sample sets of the signal a(t) and between successive ones of the sample sets of the signal b(t), wherein A depends on the effective number, wherein T depends on the effective number and the coherence function.

10. The system of claim 7, wherein said determining the power spectral density estimate includes spectrally smoothing the complex-valued averaged cross spectral density to obtain a spectrally smoothed cross spectral density, wherein said determining the statistical error bound includes computing an effective number of independent averages corresponding to said power spectral density estimate based on data including: the number n; information specifying a time-domain window that is applied to the sample sets of the signal a(t) and to the sample sets of the signal b(t); and information specifying the filter used to perform said spectral smoothing, wherein A depends on the effective number, wherein T depends on the effective number and on a coherence function associated with the spectrally smoothed cross spectral density.

11. The system of claim 10, wherein the filter used to perform the spectrally smoothing varies with frequency.

12. The system of claim 11, wherein the smoothing redistributes the complex-valued averaged cross spectral density from a linear frequency scale to a logarithmic frequency scale.

* * * * *